(12) United States Patent
Soyano

(10) Patent No.: US 10,028,400 B2
(45) Date of Patent: Jul. 17, 2018

(54) SEMICONDUCTOR DEVICE

(71) Applicant: FUJI ELECTRIC CO., LTD., Kawasaki-shi, Kanagawa (JP)

(72) Inventor: Shin Soyano, Shiojiri (JP)

(73) Assignee: FUJI ELECTRIC CO., LTD., Kawasaki-Shi, Kanagawa (JP)

( * ) Notice: Subject to any disclaimer, the term of this patent is extended or adjusted under 35 U.S.C. 154(b) by 38 days.

(21) Appl. No.: 15/200,890

(22) Filed: Jul. 1, 2016

(65) Prior Publication Data
US 2017/0042053 A1 Feb. 9, 2017

(30) Foreign Application Priority Data
Aug. 7, 2015 (JP) .................. 2015-156632

(51) Int. Cl.
*H05K 7/02* (2006.01)
*H05K 1/02* (2006.01)
(Continued)

(52) U.S. Cl.
CPC ............. *H05K 7/026* (2013.01); *H01L 24/37* (2013.01); *H01L 24/40* (2013.01); *H01L 25/07* (2013.01); *H05K 1/0298* (2013.01); *H05K 1/142* (2013.01); *H05K 1/181* (2013.01); *H05K 5/0004* (2013.01); *H05K 5/0069* (2013.01); *H01L 23/3142* (2013.01); *H01L 24/29* (2013.01); *H01L 24/32* (2013.01); *H01L 24/33* (2013.01); *H01L 24/48* (2013.01); *H01L 24/83* (2013.01); *H01L 24/84* (2013.01); *H01L 24/92* (2013.01);
(Continued)

(58) Field of Classification Search
CPC ..... H01L 24/40; H01L 25/07; H01L 29/1095; H05K 1/0298; H05K 1/142; H05K 1/181; H05K 5/0004; H05K 5/0069
See application file for complete search history.

(56) References Cited

U.S. PATENT DOCUMENTS 8,500,491 B2 * 8/2013 Suzuki .............. H01L 23/49861
439/626
2008/0158824 A1 * 7/2008 Aoki ...................... H01L 23/24
361/711

(Continued)

FOREIGN PATENT DOCUMENTS

| JP | 2000-323646 A | 11/2000 |
| JP | 2012-054449 A | 3/2012 |
| JP | 2014-053573 A | 3/2014 |

*Primary Examiner* — Hoa C Nguyen
*Assistant Examiner* — Keith Depew
(74) *Attorney, Agent, or Firm* — Rabin & Berdo, P.C.

(57) ABSTRACT

In a semiconductor device, a multilayer substrate includes an insulating substrate, a first circuit board having a first semiconductor chip disposed thereon, and a second circuit board having a second semiconductor chip disposed thereon. On the multilayer substrate of the semiconductor device, a plate portion of a resin plate including a first positioning portion that regulates the position of each semiconductor chip is sandwiched between a first jumper terminal, which includes a first terminal connected to the first semiconductor chip and a first plate member perpendicular to the first terminal, and a second jumper terminal, which includes a second terminal connected to the second semiconductor chip and a second plate member perpendicular to the second terminal.

15 Claims, 19 Drawing Sheets

(51) Int. Cl.
*H05K 1/14* (2006.01)
*H05K 1/18* (2006.01)
*H05K 5/00* (2006.01)
*H01L 25/07* (2006.01)
*H01L 23/31* (2006.01)
*H01L 23/00* (2006.01)

(52) U.S. Cl.
CPC .. *H01L 2224/291* (2013.01); *H01L 2224/293* (2013.01); *H01L 2224/29294* (2013.01); *H01L 2224/32225* (2013.01); *H01L 2224/32245* (2013.01); *H01L 2224/33181* (2013.01); *H01L 2224/3701* (2013.01); *H01L 2224/37011* (2013.01); *H01L 2224/37599* (2013.01); *H01L 2224/401* (2013.01); *H01L 2224/40137* (2013.01); *H01L 2224/40155* (2013.01); *H01L 2224/40499* (2013.01); *H01L 2224/48227* (2013.01); *H01L 2224/83801* (2013.01); *H01L 2224/84801* (2013.01); *H01L 2224/9221* (2013.01); *H01L 2224/92246* (2013.01); *H01L 2924/00014* (2013.01); *H01L 2924/1203* (2013.01); *H01L 2924/13055* (2013.01); *H01L 2924/13091* (2013.01); *H01L 2924/15159* (2013.01); *H01L 2924/15162* (2013.01); *H05K 1/0263* (2013.01); *H05K 2201/049* (2013.01); *H05K 2201/10166* (2013.01); *H05K 2201/10174* (2013.01); *H05K 2201/10363* (2013.01); *H05K 2201/10522* (2013.01)

(56) References Cited

U.S. PATENT DOCUMENTS

| | | | |
|---|---|---|---|
| 2009/0225523 A1* | 9/2009 | Onishi | H02M 7/003 361/752 |
| 2012/0058681 A1 | 3/2012 | Suzuki | |
| 2015/0243830 A1 | 8/2015 | Kondou et al. | |
| 2015/0262935 A1* | 9/2015 | Hasegawa | H01L 25/072 257/532 |

* cited by examiner

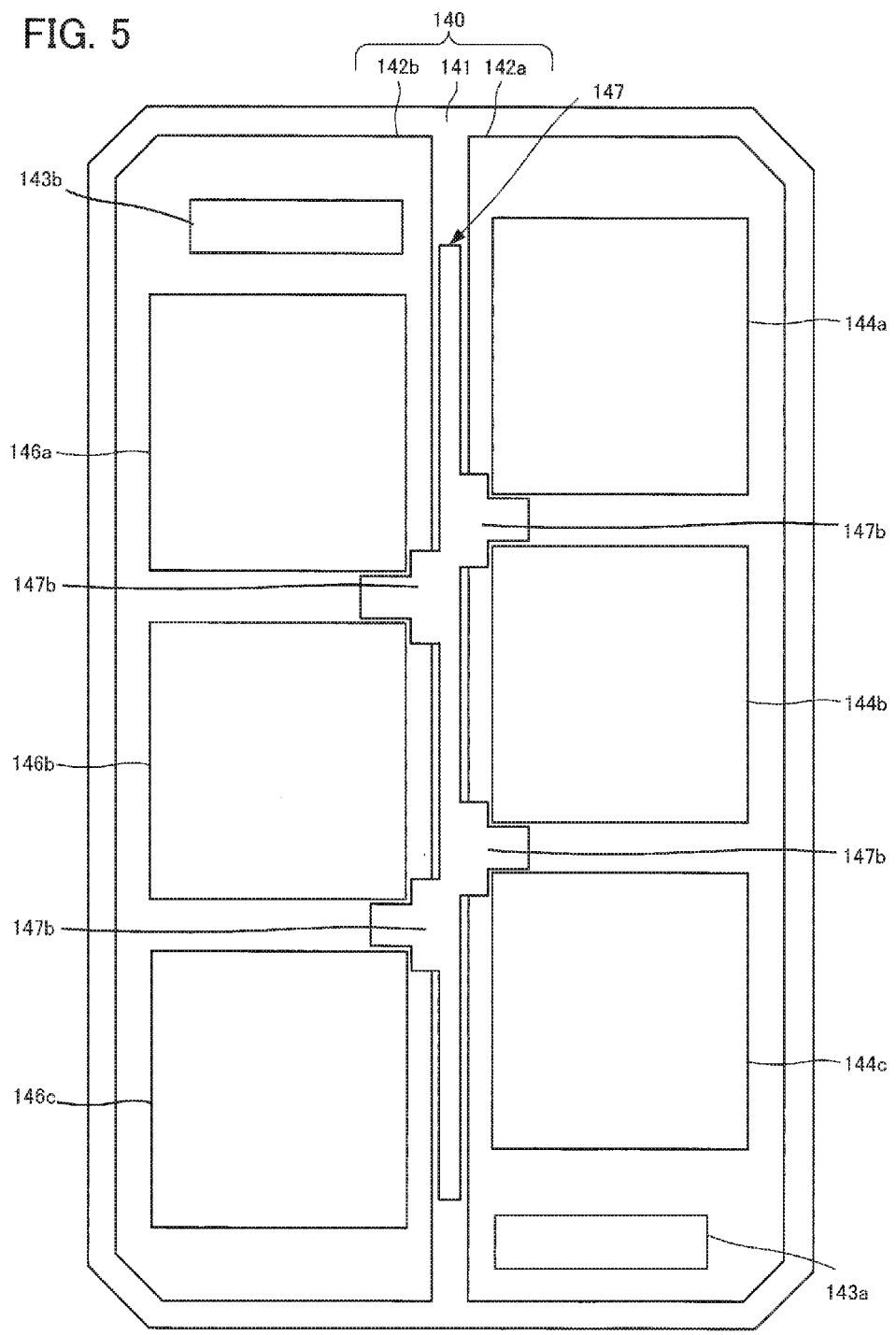

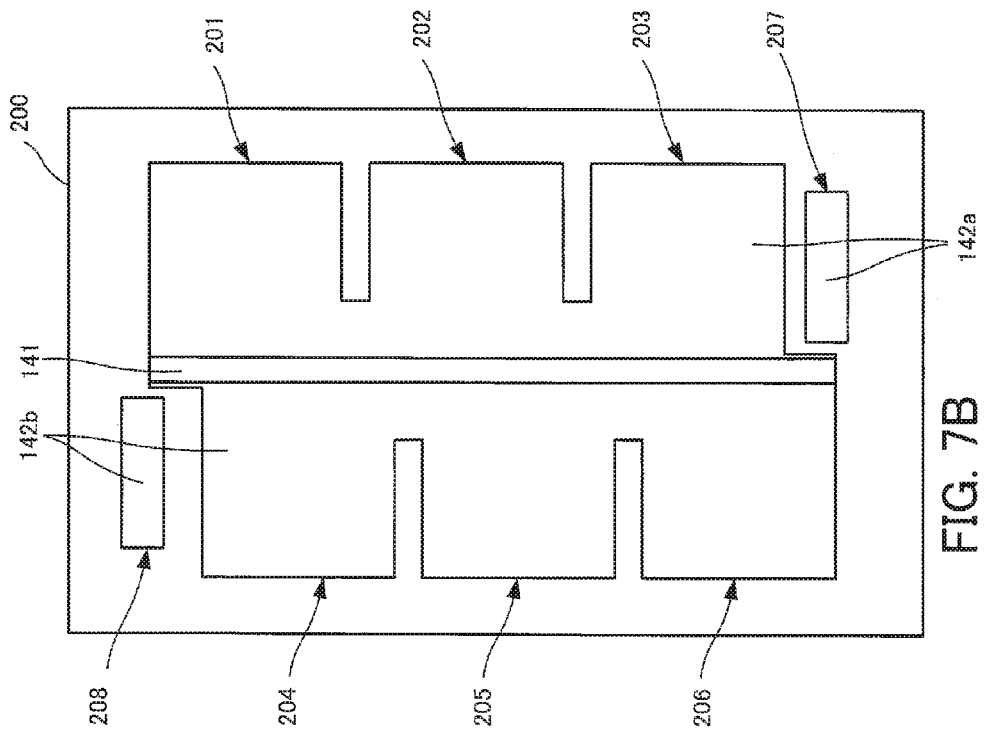
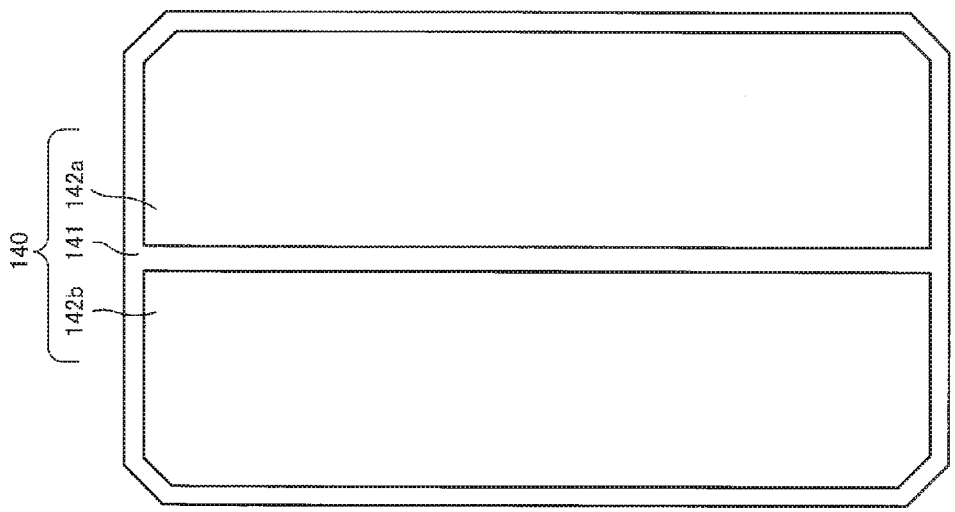
FIG. 7B
FIG. 7A

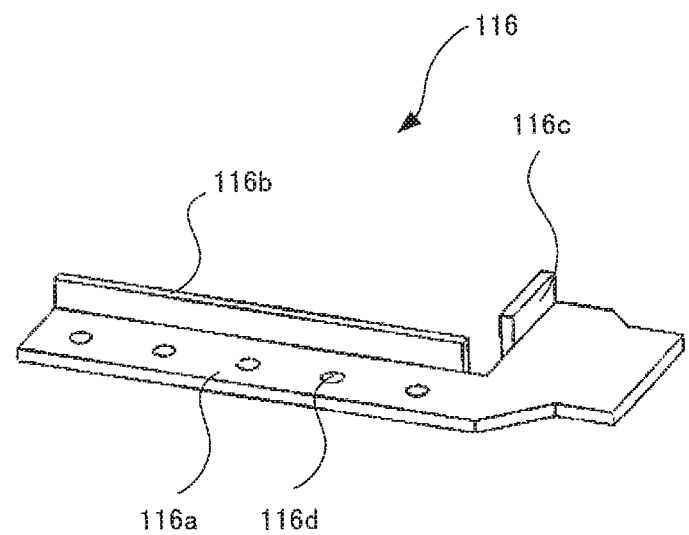
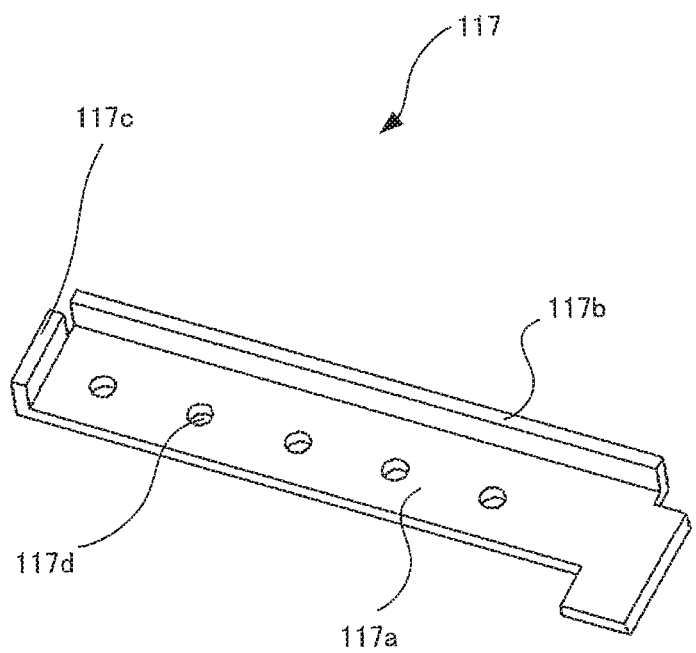
FIG. 15

SEMICONDUCTOR DEVICE

CROSS-REFERENCE TO RELATED APPLICATION

This application is based upon and claims the benefit of priority of the prior Japanese Patent Application No. 2015-156632, filed on Aug. 7, 2015, the entire contents of which are incorporated herein by reference.

BACKGROUND OF THE INVENTION

1. Field of the Invention

The present invention relates to a semiconductor device.

2. Background of the Related Art

Power semiconductor modules (also referred to in this specification as "semiconductor devices") include semiconductor chips such as IGBT (Insulated Gate Bipolar Transistors), MOSFET (Metal Oxide Semiconductor Field Effect Transistors), and FWD (Free Wheeling Diodes), and are widely used as power converting apparatuses.

This type of semiconductor device includes multilayer substrates, which have an insulating substrate and circuit patterns made of copper foil formed on the insulating substrate, and the semiconductor chips mentioned above that are disposed on the copper foil, with the multilayer substrates being housed in a case. The multilayer substrates and the semiconductor chips inside the case are wired to interconnect the electrodes of the semiconductor chips, to connect the electrodes of the semiconductor chips and external electrode terminals, and such components are sealed inside the case using resin (see for example Japanese Laid-open Patent Publication No. 2000-323646).

However, the product characteristics of a semiconductor device are affected by magnetic fields produced by currents flowing in the wiring provided to electrically connect the semiconductor chips, which results in the risk of malfunctioning. In the past, this has reduced the reliability of semiconductor devices.

SUMMARY OF THE INVENTION

In one aspect of the embodiment, there is provided a semiconductor device including: a multilayer substrate including an insulating substrate, a first circuit board disposed on a front surface of the insulating substrate, and a second circuit board disposed on the front surface in parallel with the first circuit board; a first semiconductor chip disposed on the first circuit board; a second semiconductor chip disposed on the second circuit board; a first jumper terminal including a first terminal portion, which is electrically connected to a main electrode of the first semiconductor chip, and a first plate member; a second jumper terminal including a second terminal portion, which is electrically connected to a main electrode of the second semiconductor chip, and a second plate member; and a resin plate including a first positioning portion that is placed on a front surface of the first circuit board and regulates a position of the first semiconductor chip with respect to the first circuit board, a second positioning portion that is placed on a front surface of the second circuit board and regulates a position of the second semiconductor chip with respect to the second circuit board, and a plate portion that is sandwiched between the first plate member and the second plate member at a position between the first circuit board and the second circuit board.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 5 is a plan view of a multilayer substrate on which a resin plate has been mounted in the semiconductor device according to the present embodiment;

FIGS. 7A and 7B depict assembly steps of the multilayer substrate on which a resin plate is mounted in the semiconductor device according to the present embodiment;

FIG. 15 is a perspective view of wiring terminals of the semiconductor device according to the present embodiment;

DETAILED DESCRIPTION OF THE INVENTION

Figure 1:
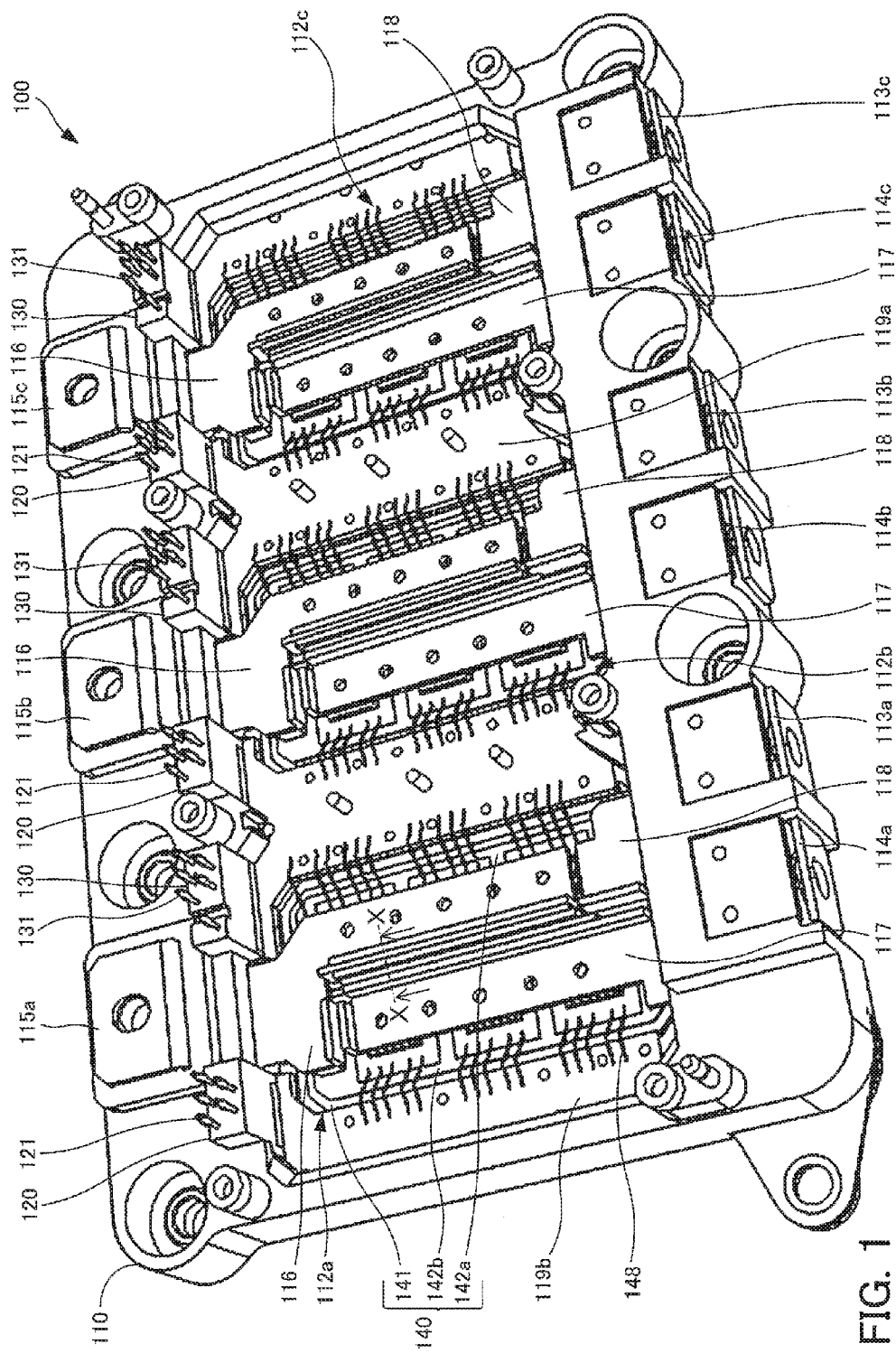
FIG. 1 is a perspective view of a semiconductor device according to the present embodiment.

An embodiment will be described below with reference to the accompanying drawings, wherein like reference numerals refer to like elements throughout. Note that the following embodiment can be implemented in combination as appropriate.

First, a semiconductor device according to the present embodiment will be described with reference to FIG. 1.

FIG. 1 is a perspective view of a semiconductor device according to the present embodiment.

A semiconductor device 100 includes a case 110 and multilayer substrates 140 that are housed in housing portions 112a, 112b, and 112c of the case 110.

In the semiconductor device 100, a positive electrode is connected to P terminals (or "second external terminals") 113a, 113b, and 113c, and a negative electrode is connected to N terminals (or "first external terminals") 114a, 114b, and 114c. A control signal is applied to control terminals 121 and 131, and an output in keeping with the control signal is obtained from a U terminal (or "third external terminal") 115a, a V terminal (or "third external terminal") 115b, and a W terminal (or "third external terminal") 115c.

Note that the case 110 and the multilayer substrates 140 housed in the case 110 that construct the semiconductor device 100 are described in detail later in this specification.

A method of manufacturing the semiconductor device 100 will now be described with reference to FIG. 2.

Figure 2:
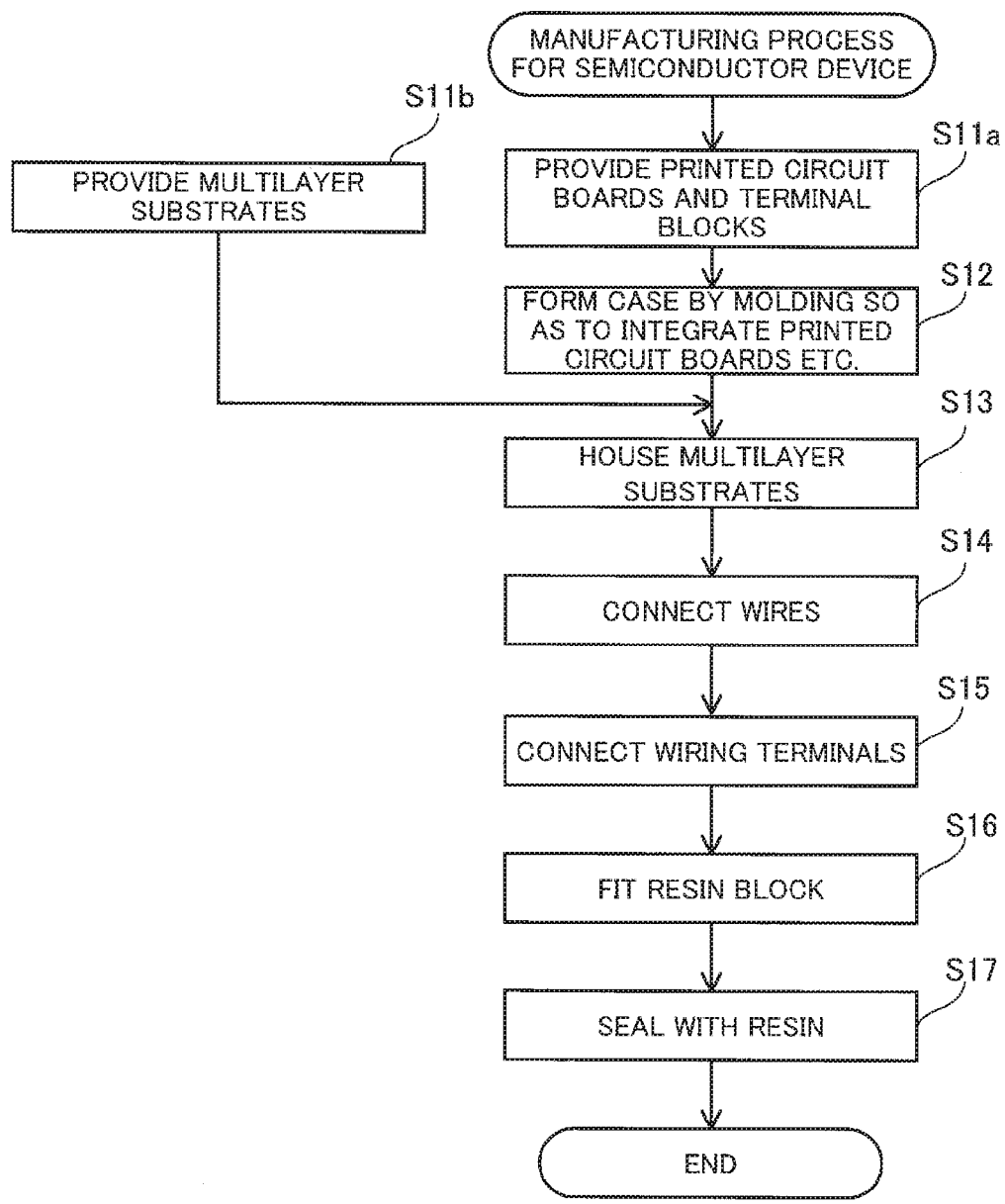
FIG. 2 is a flowchart depicting a method of manufacturing a semiconductor device according to the present embodiment.

FIG. 2 is a flowchart depicting a method of manufacturing a semiconductor device according to the present embodiment.

(Step S11) Printed circuit boards 119a and 119b and terminal blocks 120 and 130 are provided (step S11a). The multilayer substrates 140 are also provided (step S11b). In step S11a, the control terminals 121 and 131 of the terminal blocks 120 and 130 are press fitted into the printed circuit boards 119a and 119b, respectively, so that the printed circuit boards 119a and 119b become held on the lower surface side of the terminal blocks 120 and 130.

Here, the multilayer substrates 140 will be described with reference to FIG. 3.

Figure 3:
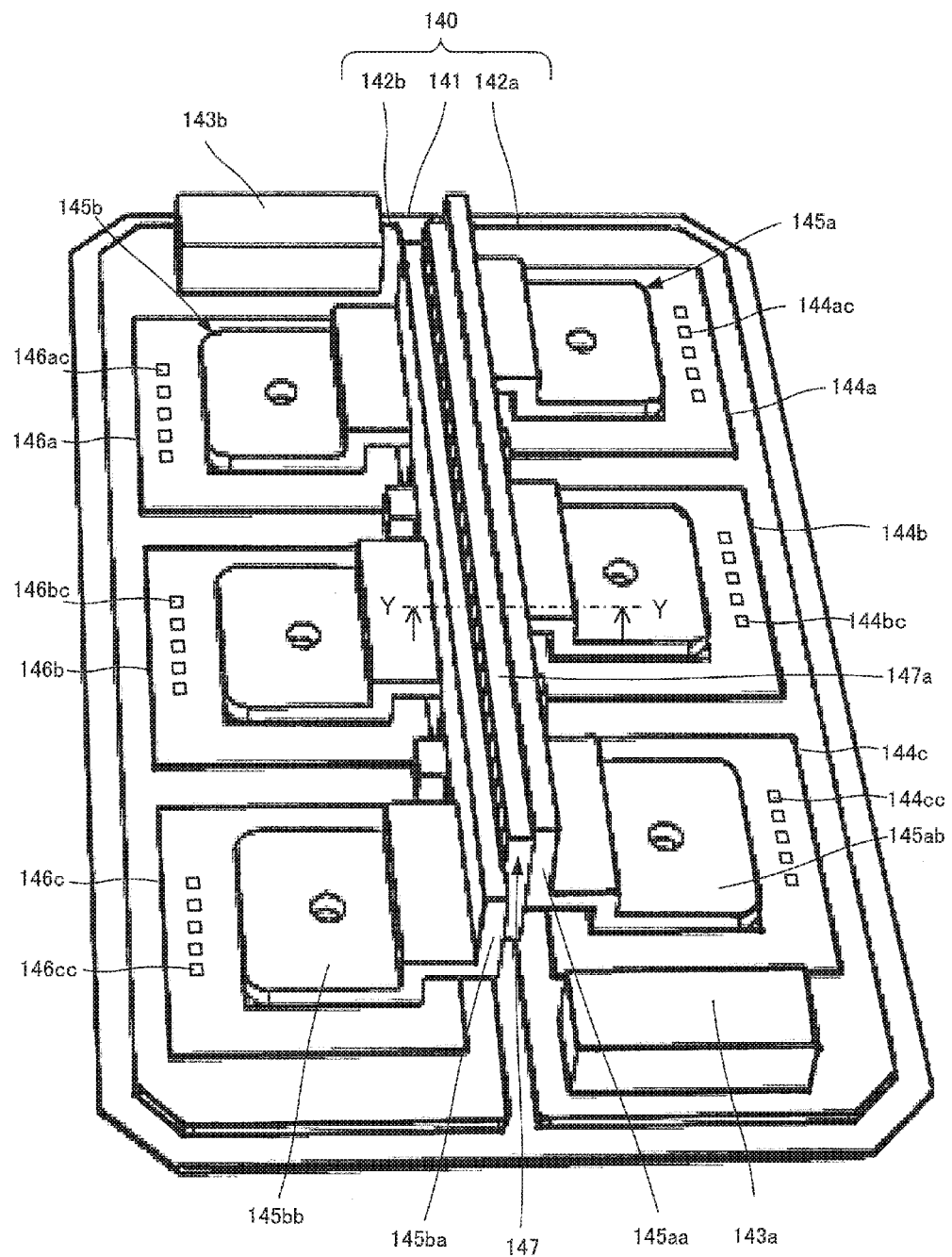
FIG. 3 is a perspective view of a state where components have been mounted on an insulating substrate of a semiconductor device according to the present embodiment.

FIG. 3 is a perspective view of a state where components have been mounted on an insulating substrate of the semiconductor device according to the present embodiment.

A multilayer substrate 140 has a heat sink (not illustrated) made of copper or the like on a lower surface of an insulating substrate 141 and circuit boards 142a and 142b made of copper foil or the like on the upper surface of the insulating substrate 141.

As one example, a conductor terminal 143a made of copper is disposed on the circuit board 142a at a bottom end in the drawing, and (collector electrode-sides of) semiconductor chips (or "first semiconductor chips") 144a, 144b, and 144c are disposed via solder in a line on the circuit board 142a. In addition, a jumper terminal (or "first jumper terminal") 145a is disposed via solder on the emitter electrodes of the semiconductor chips 144a, 144b, and 144c disposed in a line, so that the emitter electrodes of the semiconductor chips 144a, 144b, and 144c are electrically connected.

A conductor terminal 143b constructed of copper, for example, is disposed on the circuit board (or "second circuit board") 142b at a top end in the drawing, that is, at the opposite end to the conductor terminal 143a, and (collector electrode-sides of) semiconductor chips (or "second semiconductor chips") 146a, 146b, and 146c are soldered onto the circuit board 142b in a line. In addition, a jumper terminal (or "second jumper terminal") 145b is disposed via solder on the emitter electrodes of the semiconductor chips 146a, 146b, and 146c disposed in a line, so that the emitter electrodes of the semiconductor chips 146a, 146b, and 146c are electrically connected.

In the illustrated example, the semiconductor chips 144a, 144b, and 144c are electrically connected in parallel and the semiconductor chips 146a, 146b, and 146c are electrically connected in parallel. The number of semiconductor chips may be increased or decreased in accordance with the capacity of the semiconductor device.

Figure 4:
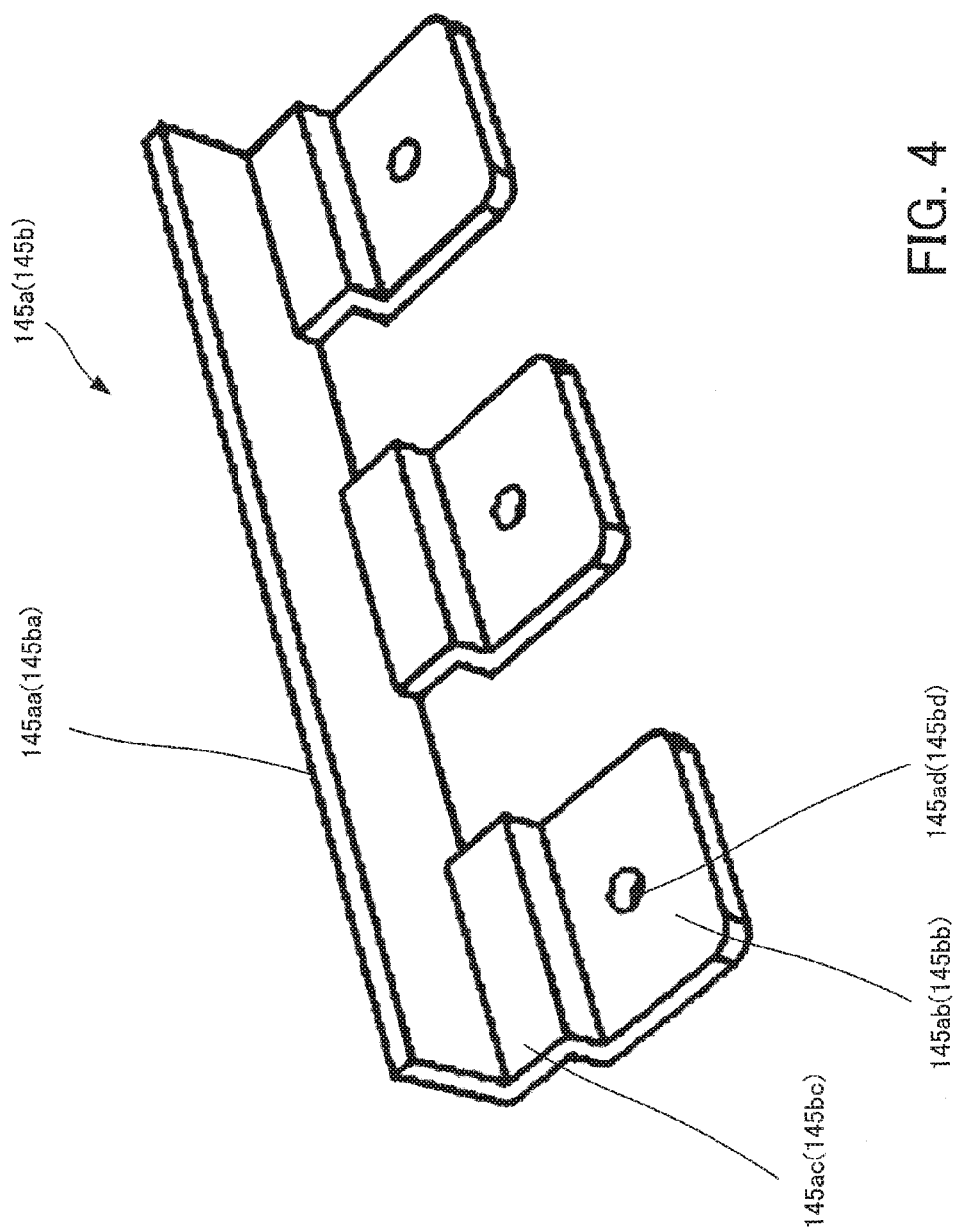
FIG. 4 is a perspective view of a jumper terminal in the semiconductor device according to the present embodiment.

The jumper terminals 145a and 145b will now be described with reference to FIGS. 3 and 4. FIG. 4 is a perspective view of a jumper terminal in the semiconductor device according to the present embodiment.

The jumper terminal 145a (145b) includes terminal portions 145ab (145bb), a plate portion (or "plate member") 145aa (145ba), and stepped portions 145ac (145bc) that connect the plate portion 145aa (145ba) and the terminal portions 145ab (145bb).

The number of terminal portions 145ab (145bb) are provided in keeping with the number of semiconductor chips to be connected, and the terminal portions 145ab (145bb) are each joined to a semiconductor chip using a joint material such as solder so as to be electrically and mechanically connected to the semiconductor chip. Each terminal portion 145ab (145bb) includes a through-hole 145ad (145bd) that passes through from the upper surface to the lower surface in the drawing. By providing the through-holes 145ad (145bd) in the terminal portions 145ab (145bb), it is possible, when sealing the semiconductor device 100 with resin, to introduce the resin into the through-holes 145ad (145bd), which increases the adhesion with the resin and makes it difficult for the resin to become detached.

The plate portion 145aa (145ba) is connected via the stepped portions 145ac (145bc) to the terminal portions 145ab (145bb), which are electrically connected to the respective semiconductor chips. The thickness of the plate portion 145aa (145ba) is 1 to 1.5 mm, for example. In the illustrated example, the main surface of the plate portion 145aa (145ba) and the main surfaces of the terminal portions 145ab (145bb) are substantially perpendicular and the stepped portions 145ac (145bc) have surfaces that are substantially parallel with such two main surfaces, so that the jumper terminal 145a (145b) is shaped as a zigzag in cross section.

The stepped portions 145ac (145bc) support wiring terminals 116 (117), described later, from below.

As depicted in FIG. 3, the plate portion 145aa of the jumper terminal 145a and the plate portion 145ba of the jumper terminal 145b are disposed so as to face each other in parallel. Also, as depicted in FIG. 3, when viewed from above, the jumper terminal 145a protrudes upward in the drawing beyond the jumper terminal 145b and the jumper terminal 145b protrudes downward in the drawing beyond the jumper terminal 145a. The plate portion 145aa and the plate portion 145ba are disposed so as to be shifted with a resin plate 147 in between. One end of the plate portion 145aa is disposed closer to a first end of the multilayer substrate 140 than the same end of the plate portion 145ba and the other end of the plate portion 145ba is disposed so as to be closer to a second end on the opposite side to the first end of the multilayer substrate 140 than the same end of the plate portion 145aa.

The resin plate 147 is disposed between the jumper terminal 145a and the jumper terminal 145b so that the jumper terminal 145a and the jumper terminal 145b are supported on the resin plate 147.

Figure 6B:
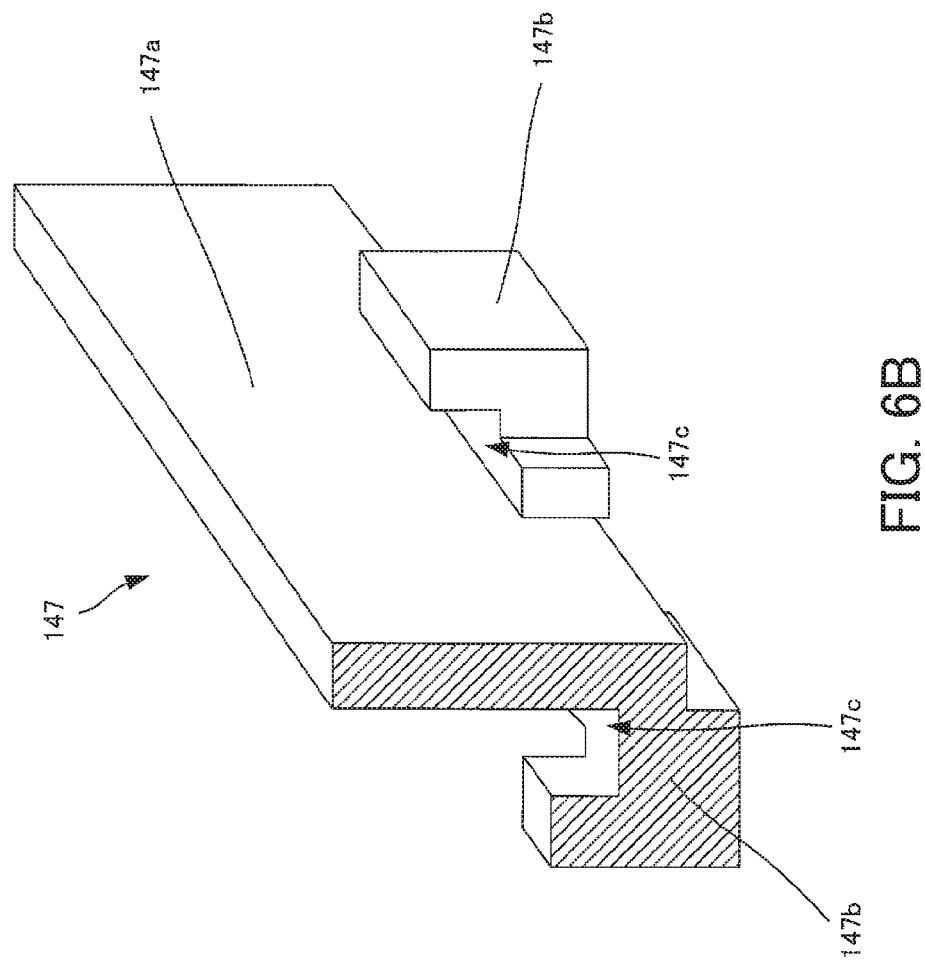
FIGS. 6A and 6B depict a resin plate used in the semiconductor device according to the present embodiment.
Figure 6A:
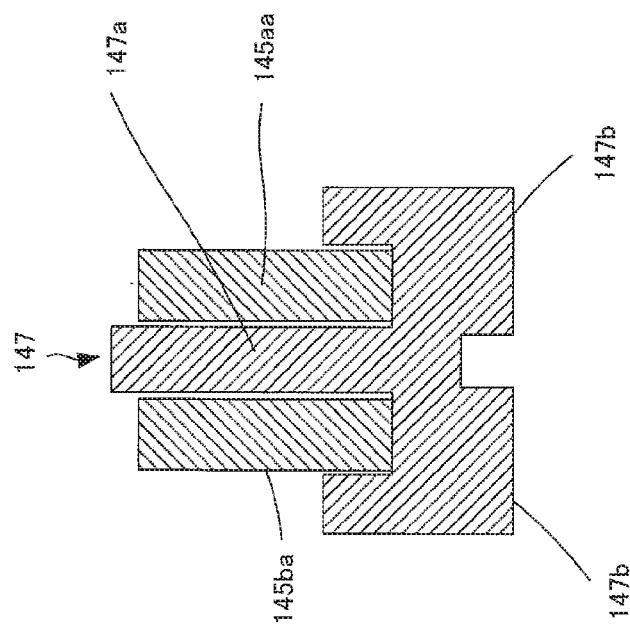

The resin plate 147 will now be described with reference to FIGS. 3, 5, 6A, and 6B. FIG. 5 is a plan view of a multilayer substrate on which a resin plate has been mounted in the semiconductor device according to the present embodiment, and compared to FIG. 3 depicts a state where the jumper terminals 145a and 145b have been removed. FIGS. 6A and 6B depict the resin plate used in the semiconductor device according to the present embodiment. FIG. 6A is a schematic cross-sectional view of the resin plate 147 and the plate portions 145aa and 145ba taken along a dot-dash line Y-Y in FIG. 3, and FIG. 6B is a perspective view of the state in FIG. 6A with the plate portions 145aa and 145ba removed.

The resin plate 147 has a plate portion 147a and positioning portions 147b. As depicted in FIG. 3, the plate portion 147a is disposed between the plate portion 145aa and the plate portion 145ba (which is also between the circuit board 142a and the circuit board 142b). Also as depicted in FIG. 3, when viewed from above, the plate portion 147a protrudes upward in the drawing beyond the plate portion 145ba (by 1 mm or further, for example) and downward in the drawing beyond the plate portion 145aa (by 1 mm or further, for example). As depicted in FIG. 6A, when viewed in cross-section, the plate portion 147a protrudes upward in the drawing beyond the plate portions 145aa and 145ba (by 1 mm or further, for example). First ends in the length direction of the plate portion 145aa, the plate portion 147a, and the plate portion 145ba are disposed so as to be respectively displaced in that order, so that two side surfaces of the plate portion 147a that are adjacent to the first end are exposed between the plate portions 145aa and 145ba. Second ends on the opposite side to the first ends of the plate portion 145aa, the plate portion 147a, and the plate portion 145ba are disposed so as to be similarly displaced in that order.

That is, the plate portion 147a is interposed at a part (or "overlapping region") where the plate portion 145aa and the plate portion 145ba face one another in parallel.

By disposing the plate portion 147a between the plate portion 145aa and the plate portion 145ba, it is possible in the semiconductor device 100 to ensure a suitable creepage distance and spatial distance between the jumper terminal 145a and the jumper terminal 145b. That is, it is possible to ensure that the jumper terminal 145a and the jumper terminal 145b will be insulated from one another in the semiconductor device 100.

The positioning portions 147b are provided on opposite surfaces of the plate portion 147a, that is, on the circuit board 142a side and the circuit board 142b side, and make tight contact with the circuit boards 142a and 142b. As depicted in FIG. 5, when viewed from above, the positioning portions 147b are formed as protrusions or T shapes (or "stepped shapes") and are located between the semiconductor chips 144a and 144b, between the semiconductor chips 144b and 144c, between the semiconductor chips 146a and 146b, and between the semiconductor chips 146b and 146c. Each positioning portion 147b is disposed so that the protruding stepped part is located at a part corresponding to the respective corners of two rectangular semiconductor chips and the respective positions of the semiconductor chips (i.e., the positions of two edges) are regulated (or "fixed") by two edges of the stepped portion. By providing the positioning portions 147b at displaced positions on the circuit board 142a side and the circuit board 142b side of the resin plate 147, the resin plate 147 is stabilized against falling over.

As depicted in FIGS. 6A and 6B, the positioning portions 147b have slits (or "insertion portions") 147c into which the jumper terminals 145a and 145b are inserted. Parts of the plate portion 145aa where the stepped portions 145ac of the jumper terminal 145a are not provided are inserted into the slits 147c. Similarly, parts of the plate portion 145ba where the stepped portions 145bc of the jumper terminal 145b are not provided are inserted into the slits 147c.

In this way, by inserting the jumper terminals 145a and 145b into the slits 147c, it is possible during assembly for the resin plate 147 to support the jumper terminals 145a and 145b so as to stop the jumper terminals 145a and 145b from falling over.

The slits 147c are sized so that the inserted plate portions 145aa (145ba) are capable of sliding up and down.

As described later, although the jumper terminal 145a is disposed on the multilayer substrate 140 in the state where the plate portion 145aa is inserted into the slits 147c, since the plate portion 145aa is capable of sliding inside the slits 147c, it is possible to guide the terminal portions 145ab to appropriate positions with the plate portion 145aa in the inserted state. Similarly, although the jumper terminal 145b is disposed on the multilayer substrate 140 in the state where the plate portion 145ba is inserted into the slits 147c, since the plate portion 145ba is capable of sliding inside the slits 147c, it is possible to guide the terminal portions 145bb to appropriate positions with the plate portion 145ba in the inserted state. That is, by sliding the plate portion 145aa (145ba) inside the slits 147c, it is possible to move the terminal portions 145ab (145bb) to appropriate positions in a state where the positioning portions 147b of the resin plate 147 tightly contact the circuit boards 142a and 142b.

Note that in place of the slits 147c of the positioning portions 147b, it is possible to provide a holding mechanism that holds the jumper terminals 145a and 145b on the plate portion 147a.

Note that the shape of the positioning portions 147b is not limited to the protruding shape in this example. The shape of the positioning portions 147b may be any shape capable of regulating the positions of the semiconductor chips. Also, instead of being equipped with the positioning portions 147b, it is possible to make the resin plate 147 thicker than the thickness of the plate portion 147a depicted in FIG. 5 so as to extend as far as and tightly contact the circuit boards 142a and 142b so that the positions (i.e., the positions of one edge) of the semiconductor chips are regulated by the plate portion 147a. As the material of the resin plate 147, it is possible to use a resin that is compatible with soldering, such as liquid crystal plastic (LCP) or polyphenylene sulfide (PPS).

IGBT, MOSFET, FWD, or the like are used as the semiconductor chips 144a, 144b, 144c, 146a, 146b, and 146c. FIG. 3 depicts an example where RC-IGBT (Reverse Conducting-IGBT) are used as the semiconductor chips 144a and the like. As the substrate of the semiconductor chips, aside from silicon, it is also possible to use silicon carbide, gallium nitride, or the like. In addition to the main electrodes (the emitter electrodes and the collector electrodes), the semiconductor chips 144a and the like may include a plurality of control electrodes 144ac, 144bc, 144cc, 146ac, 146bc, and 146cc connected to a gate terminal, a sensing terminal, a chip temperature measuring terminal, or the like.

Assembly steps of a multilayer substrate on which a resin plate is mounted will now be described with reference to FIG. 7A to FIG. 9. FIG. 7A to FIG. 9 depict assembly steps of a multilayer substrate on which a resin plate is mounted in the semiconductor device according to the present embodiment.

First, as depicted in FIG. 7A, the multilayer substrate 140 where a heat sink (not illustrated) made of copper or the like is disposed on a lower surface of an insulating substrate 141 and the circuit boards 142a and 142b made of copper foil or the like is disposed on the upper surface (or "front surface") of the insulating substrate 141 is provided.

Next, as depicted in FIG. 7B, a jig 200 used to position electronic components (such as the conductor terminals and semiconductor chips) to be disposed on the multilayer substrate 140 is placed on the multilayer substrate 140. The jig 200 includes semiconductor chip housing portions 201, 202, 203, 204, 205, and 206 that expose the multilayer substrate 140 (more specifically, the circuit boards 142a and 142b) at positions where the semiconductor chips are to be disposed. The jig 200 is also provided with conductor terminal housing portions 207 and 208 that expose the multilayer substrate 140 (more specifically, the circuit boards 142a and 142b) at positions where the conductor terminals are to be disposed.

Figure 8B:
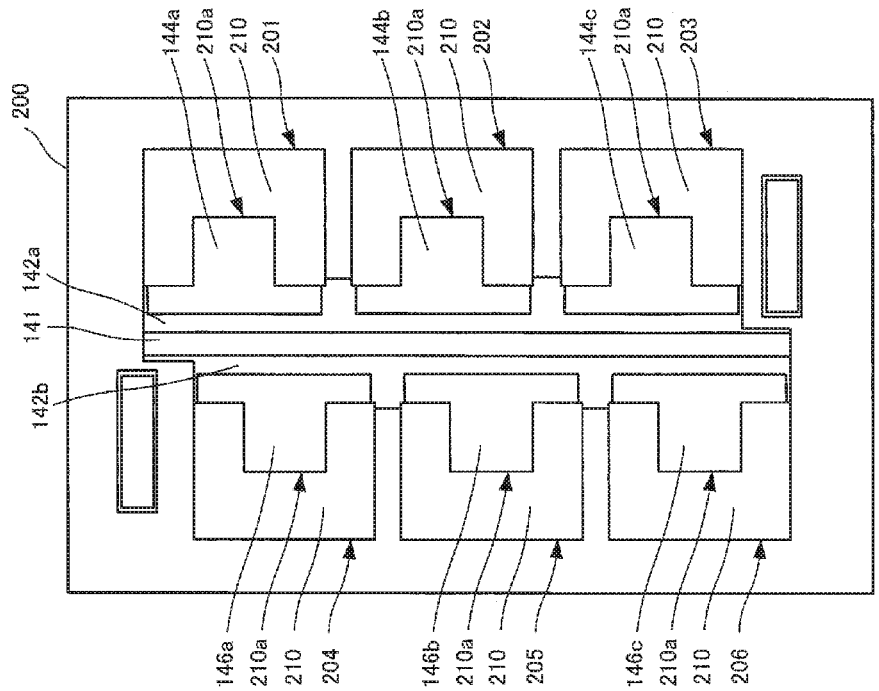
FIGS. 8A and 8B depict other assembly steps of the multilayer substrate on which a resin plate is mounted in the semiconductor device according to the present embodiment.
Figure 8A:
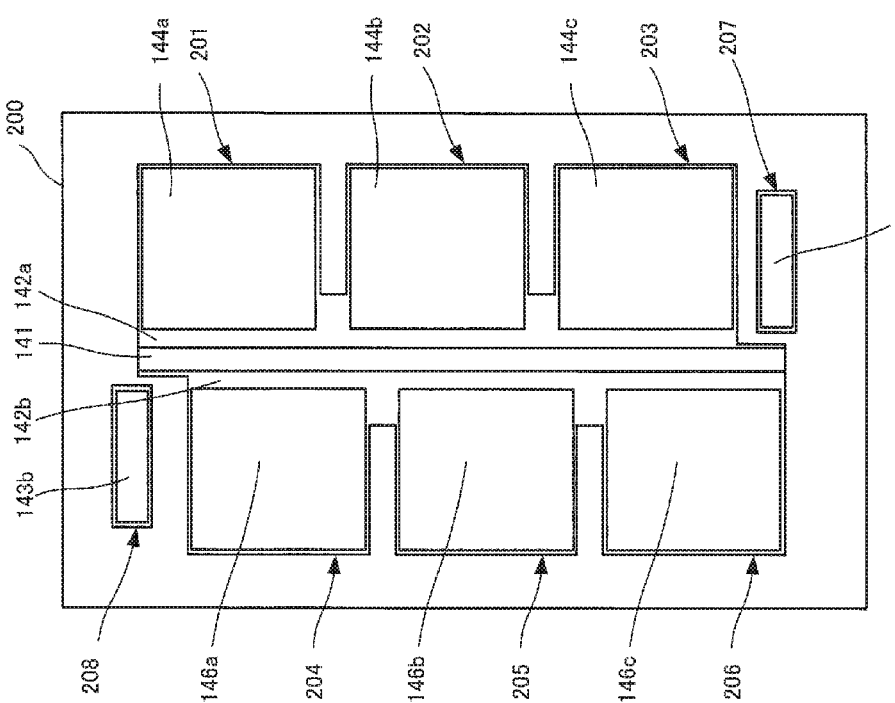
Figure 9:
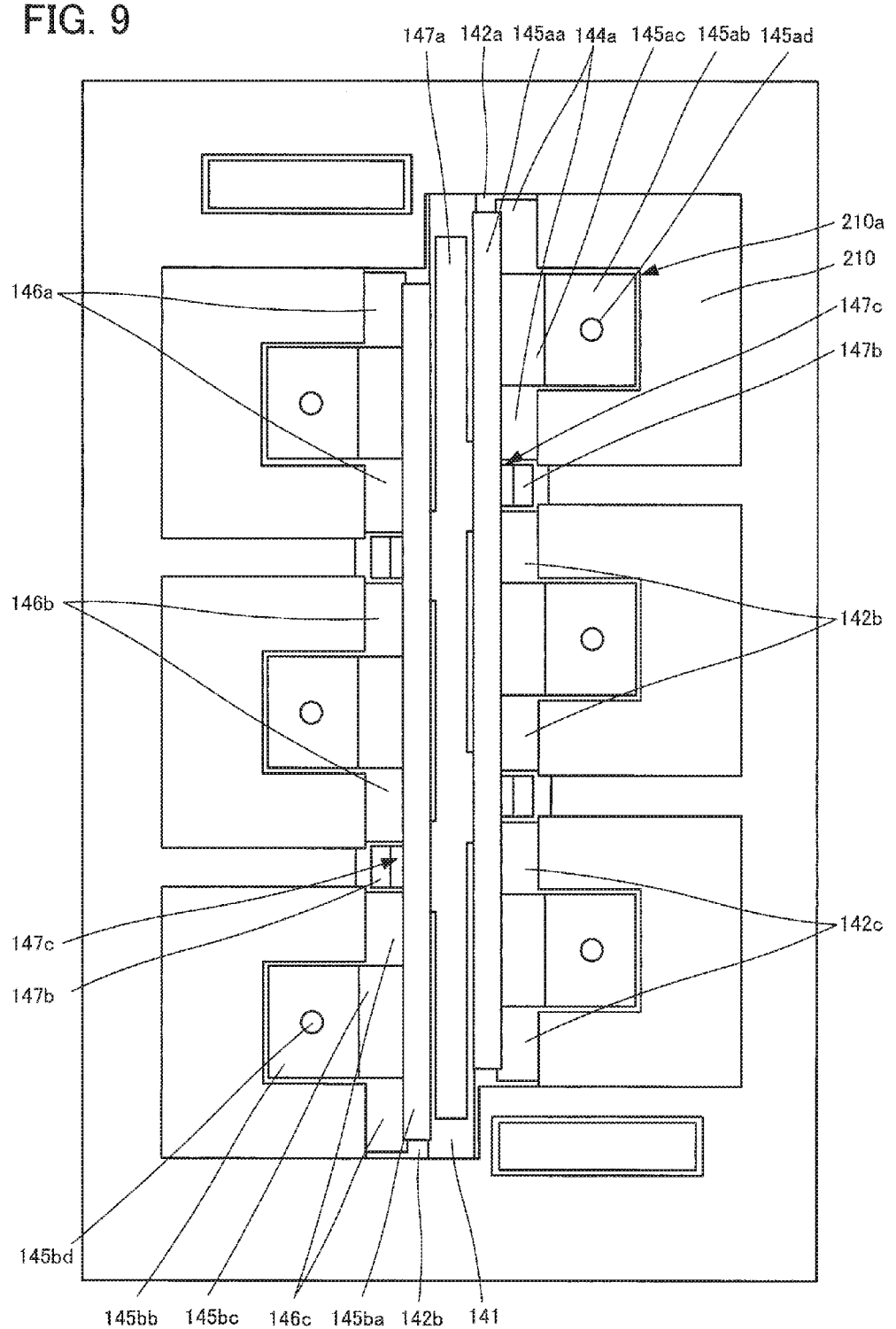
FIG. 9 depicts other assembly steps of the multilayer substrate on which a resin plate is mounted in the semiconductor device according to the present embodiment.

Next, as depicted in FIGS. 8A, 8B, and 9, the semiconductor chips 144a to 144c and 146a to 146c, the jumper terminals 145a and 145b, and the resin plate 147 are disposed on the circuit boards 142a and 142b, and the circuit boards 142a and 142b, the semiconductor chips 144a to 144c and 146a to 146c, and the jumper terminals 145a and 145b are joined by soldering in a state where the semiconductor chips 144a to 144c and 146a to 146c are being positioned by the resin plate 147.

After this, as depicted in FIG. 8A, electronic components are disposed via solder on the multilayer substrate 140. Solder material and the semiconductor chips 144a to 144c and 146a to 146c are disposed in that order on the circuit boards 142a and 142b inside the semiconductor chip housing portions 201, 202, 203, 204, 205, and 206. Also, solder material and the conductor terminals 143a and 143b are disposed in that order on the circuit boards 142a and 142b inside the conductor terminal housing portions 207 and 208.

Next, as depicted in FIG. 8B, jigs 210 used to position the terminal portions 145ab and 145bb are disposed on the semiconductor chips disposed in the semiconductor chip housing portions 201, 202, 203, 204, 205, and 206. A terminal portion housing portion 210a that exposes the main electrode (emitter electrode) of a semiconductor chip is provided on each jig 210 at a position where a terminal portion 145ab or 145bb is to be disposed.

Next, as depicted in FIG. 9, the resin plate 147 that has the plate portions 145aa and 145ab of the jumper terminals 145a and 145b inserted into the slits 147c is disposed on the multilayer substrate 140. A solder material is disposed between the terminal portions 145ab and 145bb and the main electrodes of the semiconductor chips.

The components and jigs that have been combined in this way are placed in a furnace and the various members are soldered together by heating, melting, and cooling the solder material. By doing so, rear surfaces (the collector electrodes) of the semiconductor chips 144a, 144b, and 144c and 146a, 146b, and 146c are joined to the circuit boards 142a and 142b by soldering, rear surfaces of the conductor terminals 143a and 143b are joined to the circuit boards 142a and 142b by soldering, and the terminal portions 145ab and 145bb and the front surfaces (the emitter electrodes) of the semiconductor chips are joined by soldering. The solder material is lead-free bar solder or paste solder, for example.

Note that although soldering is performed in a single operation in the example described above in a state where the components have been assembled as far as the state depicted in FIG. 9, it is also possible to divide the soldering into multiple operations. As one example, it is possible, at a stage where electronic components have been disposed on the multilayer substrate 140 as depicted in FIG. 8A, to solder the rear surfaces of the semiconductor chips 144a to 144c and 146a to 146c and the rear surfaces of the conductor terminals 143a and 143b to the circuit boards 142a and 142b and then at a stage where the resin plate 147 has been disposed on the multilayer substrate 140 as depicted in FIG. 9, to join the front surfaces of the semiconductor chips 144a to 144c and 146a to 146c to the terminal portions 145ab and 145bb by soldering.

The resin plate 147 is disposed on the multilayer substrate 140 so that the positioning portions 147b tightly contact the circuit boards 142a and 142b and the positions of the semiconductor chips 144a to 144c and 146a to 146c are regulated from the insides (the center sides) thereof.

That is, in a state where the resin plate 147 is disposed on the multilayer substrate 140, the positions of the semiconductor chips 144a to 144c and 146a to 146c are regulated from the outside by the jig 200 and from the inside by the positioning portions 147b.

In this state, the plate portions 145aa and 145ba inserted in the slits 147c are slid inside the slits 147c to move the terminal portions 145ab and 145bb to appropriate positions in the terminal portion housing portions 210a of the jigs 210. The rear surfaces of the terminal portions 145ab and 145bb and the respective semiconductor chips are then soldered to join the terminal portions 145ab and 145bb to the semiconductor chips. After this, the jigs 200 and 210 are removed. By doing so, the construction of the multilayer substrate 140 depicted in FIG. 3 is obtained.

In this way, since the terminal portions 145ab and 145bb are joined in a state where the respective positions of the semiconductor chips are regulated from the outside by the jig 200 and from the inside by the positioning portions 147b, it is possible to prevent the semiconductor chips from moving from the appropriate positions due to heat during the joining process or the like.

By positioning the semiconductor chips with the jig 200 from the outside only and positioning from the inside with the resin plate 147 which is used to keep the jumper terminals 145a and 145b insulated from one another, it is possible to easily remove the jig 200 from the multilayer substrate 140 after assembly.

Next, the terminal blocks 120 and 130 will be described with reference to FIGS. 10 to 12.

Figure 10:
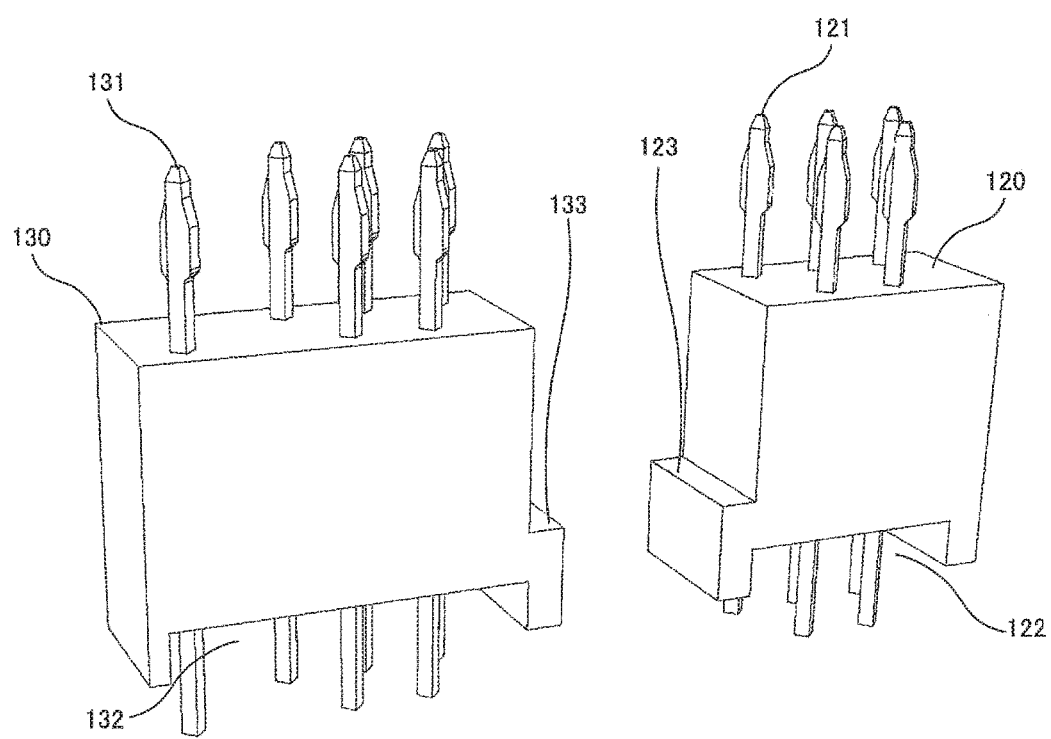
FIG. 10 is a perspective view of terminal blocks in the semiconductor device according to the present embodiment.

FIG. 10 is a perspective view of terminal blocks in the semiconductor device according to the present embodiment.

Figure 11:
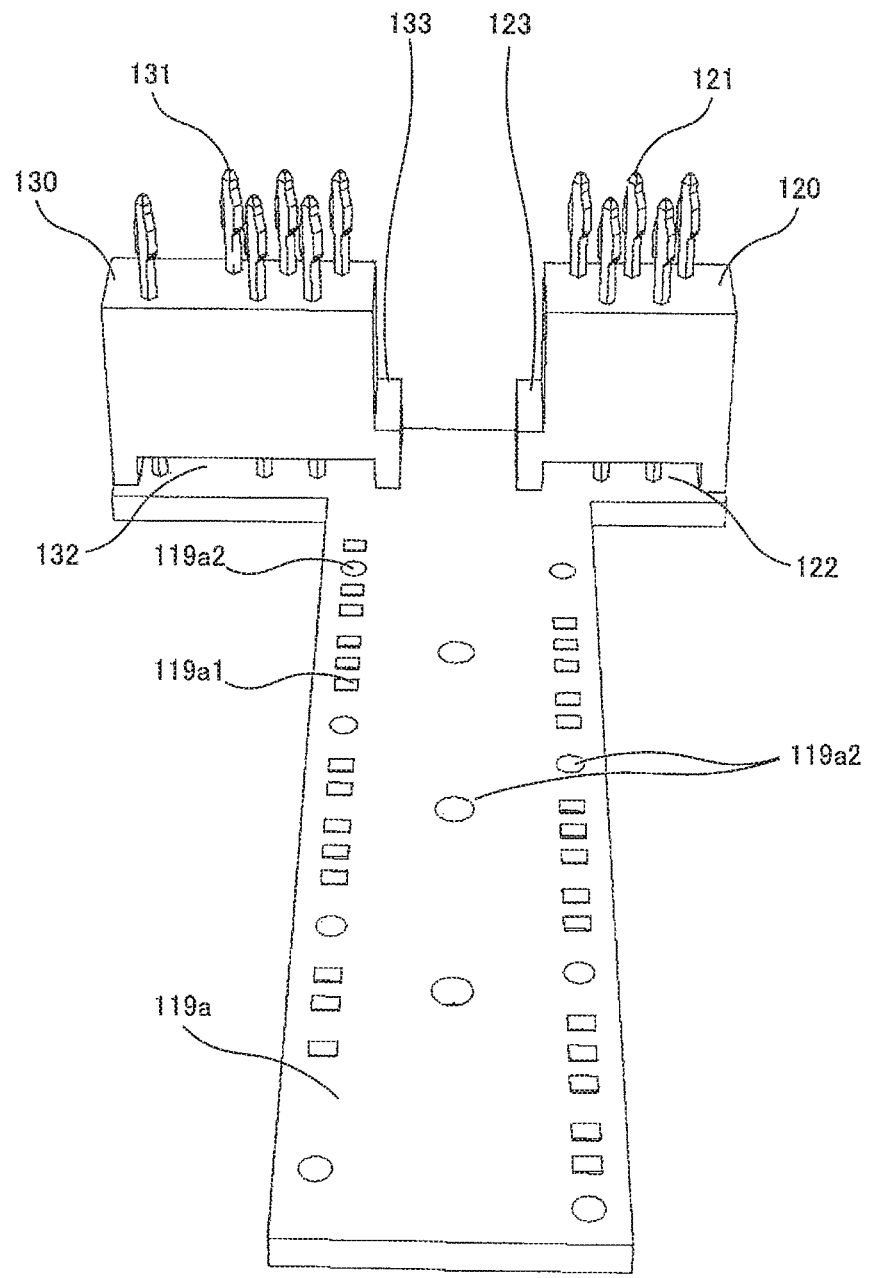
FIG. 11 is a perspective view (first view) of a printed circuit board and terminal blocks in the semiconductor device according to the present embodiment.
Figure 12:
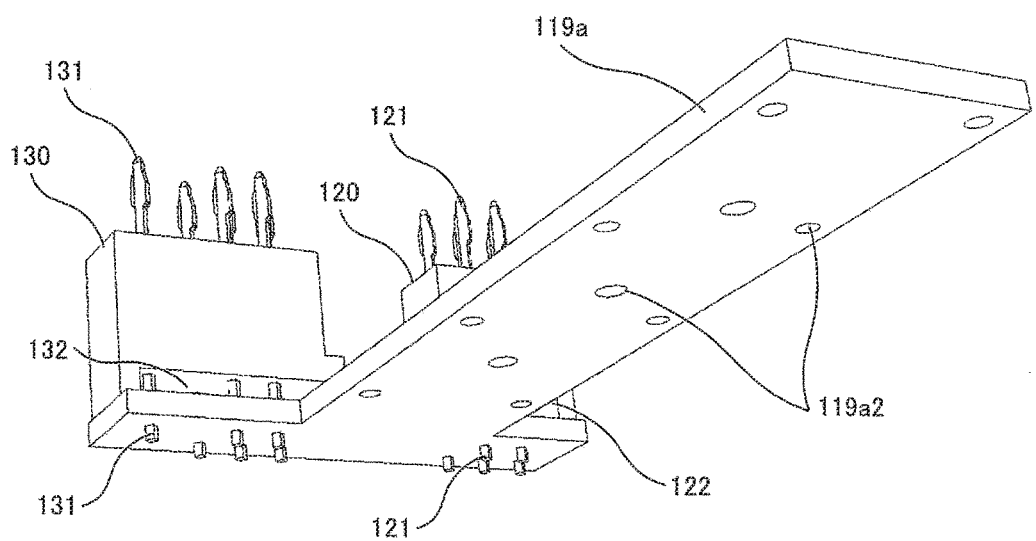
FIG. 12 is a perspective view (second view) of the printed circuit board and the terminal blocks in the semiconductor device according to the present embodiment.

FIGS. 11 and 12 are perspective views of a printed circuit board and terminal blocks in a semiconductor device according to the present embodiment. Note that FIGS. 11 and 12 depict a case where the terminal blocks 120 and 130 are disposed on the printed circuit board 119a.

As depicted in FIG. 10, the terminal blocks 120 and 130 are made of resin, are integrally molded with control terminals (external connection terminals) 121 and 131, and are formed in substantially rectangular solid shapes. Gaps 122 and 132 that are defined by two protrusions are respectively formed on lower surface (or "second surface") sides of the terminal blocks 120 and 130. The lower surfaces of the terminal blocks 120 and 130 are mounted on the printed circuit board 119a. Note that the gaps 122 and 132 pass through from a front surface side of the terminal blocks 120 and 130 in the drawing to the rear surface side. Stepped portions 123 and 133 are respectively formed on the facing surfaces of the terminal blocks 120 and 130.

The terminal blocks 120 and 130 described above hold the plurality of control terminals 121 and 131. The respective control terminals 121 and 131 are formed so that both end portions thereof are thicker than a central trunk portion. The terminal blocks 120 and 130 hold the trunk portions of the control terminals 121 and 131 and both end portions that are thicker than the trunk portions protrude from the upper surfaces (first surfaces) and the lower surfaces (second surfaces) in the drawing of the terminal blocks 120 and 130. As described later, the lower end portions of the control terminals 121 and 131 that protrude from the lower surfaces of the terminal blocks 120 and 130 are press fitted into through-holes provided in the printed circuit board 119a. Note that in FIG. 10, the control terminals 121 and 131 are formed in two rows on the terminal blocks 120 and 130. By doing so, compared to a case where the control terminals 121 and 131 are formed in a single row, it is possible to increase the number of control terminals 121 and 131 held by the terminal blocks 120 and 130. The terminal blocks 120 and 130 are not limited to having two rows of the control terminals 121 and 131 and by providing three or more rows, it is possible to increase the number of control terminals 121 and 131 that are held. The terminal blocks 120 and 130 are disposed at one end of the printed circuit board 119a.

Note that the printed circuit board (or "circuit wiring substrate") 119a used when forming the case 110 includes a wiring layer made of a conductive material and a substrate made of a material with high heat resistance, and has a plurality of electrodes 119a1, which are electrically connected to the wiring layer, laid out on the front surface. The wiring layer may be a single layer, may use a configuration where layers are provided on both surfaces, or may be a multilayer configuration. The printed circuit board 119a has a plurality of through-holes 119a2 that pass through from the upper surface (first main surface) to the lower surface (second main surface). As described later, when the printed circuit board 119a is integrally formed with the case 110, by introducing the resin used to form the case 110 into the through-holes 119a2, it is easy to fix the printed circuit board 119a to the case 110. It is preferable to dispose a plurality of through-holes 119a2 so as to be located on both sides of the plurality of electrodes 119a1 that are provided in a row. By fixing the printed circuit board 119a with resin inside the through-holes 119a2 at positions close to the electrodes 119a1, it is possible to increase the reliability of a later step that makes connections using wires 148.

It is also possible to form a pattern using copper on the rear surface of the printed circuit board 119a and then intentionally provide convexes and concaves on the surface of the pattern by performing a blackening treatment. By doing so, when integrally molding the printed circuit board 119a in the case 110, the convexes and concaves on the rear surface will engage the resin of the case 110, which makes it easier to fix the printed circuit board 119a to the case 110. A solid (continuous) pattern in a wiring layer provided on the lower surface may also be used as a shield. It is preferable for no residue, such as a resist, to remain on the lower surface of the printed circuit board 119a.

The terminal blocks 120 and 130 are disposed by press fitting and connecting the lower ends of the control terminals 121 and 131, which protrude from the lower surfaces of the terminal blocks 120 and 130, into the printed circuit board 119a described above. By doing so, the printed circuit board 119a is electrically connected to the control terminals 121 and 131. As depicted in FIG. 12, the end portions of the control terminals 121 and 131 may be exposed at or protrude beyond the lower surfaces of the printed circuit boards 119a and 119b.

Note that when the lower end portions of the control terminals 121 and 131 have the same thickness as trunk portions, it is also possible to connect the control terminals 121 and 131 to the printed circuit board 119a by soldering without press fitting. With the configuration, the lower end portions of the control terminals 121 and 131 that have passed through the printed circuit board 119a (from the front surface side of the printed circuit board 119a) are soldered on the rear surface side of the printed circuit board 119a. However, there can be cases where the solder melts due to high temperature and molten resin becomes mixed in the resin. To prevent the molten resin from flowing into the resin, it is possible to cover soldered parts of the control terminals 121 and 131 on the rear surface sides of the printed circuit board 119a with epoxy resin and perform a hardening process on the epoxy resin. Accordingly, when attaching the control terminals 121 and 131 to the printed circuit board 119a, it is preferable to perform press fitting rather than using solder.

It is also possible to provide a control circuit on the printed circuit board 119a and to mount electronic components and the like that are electrically connected to the control terminals 121 and 131. Note that the printed circuit board 119b described later can also have the same configuration as the printed circuit board 119a and can be handled in the same way.

The multilayer substrate 140, the printed circuit boards 119a and 119b, and the terminal blocks 120 and 130 described above are provided.

(Step S12) The case 110 is molded using resin so as to be integrated with the printed circuit boards 119a and 119b on which the terminal blocks 120 and 130 have been disposed, wiring terminals (or "third wiring terminals") 118, P terminals 113a, 113b, and 113c, N terminals 114a, 114b, and 114c, a U terminal 115a, a V terminal 115b, a W terminal 115c, and the like.

The case 110 formed in this way will now be described with reference to FIGS. 13 and 14.

Figure 13:
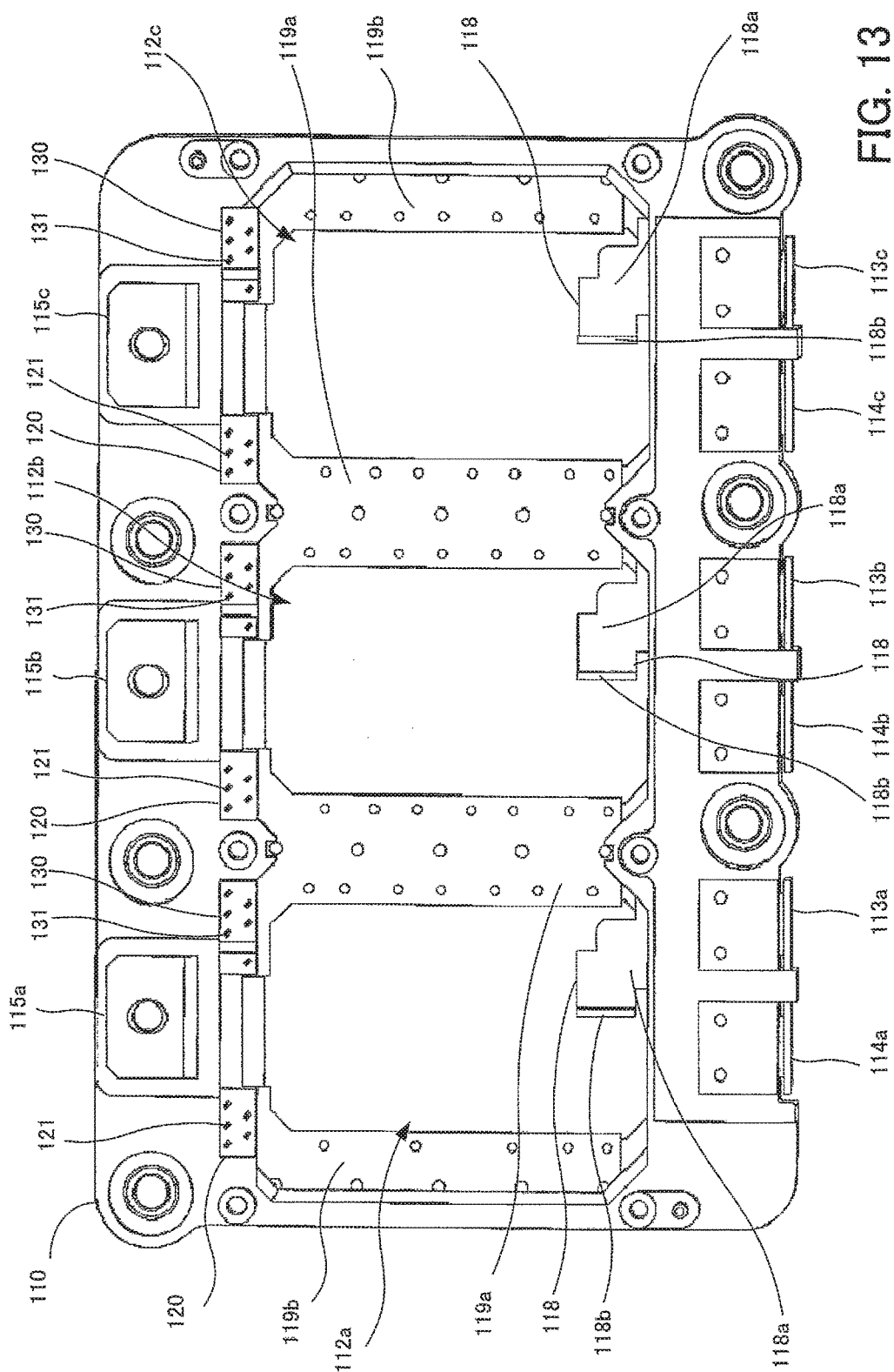
FIG. 13 is a plan view of a case of the semiconductor device according to the present embodiment.
Figure 14:
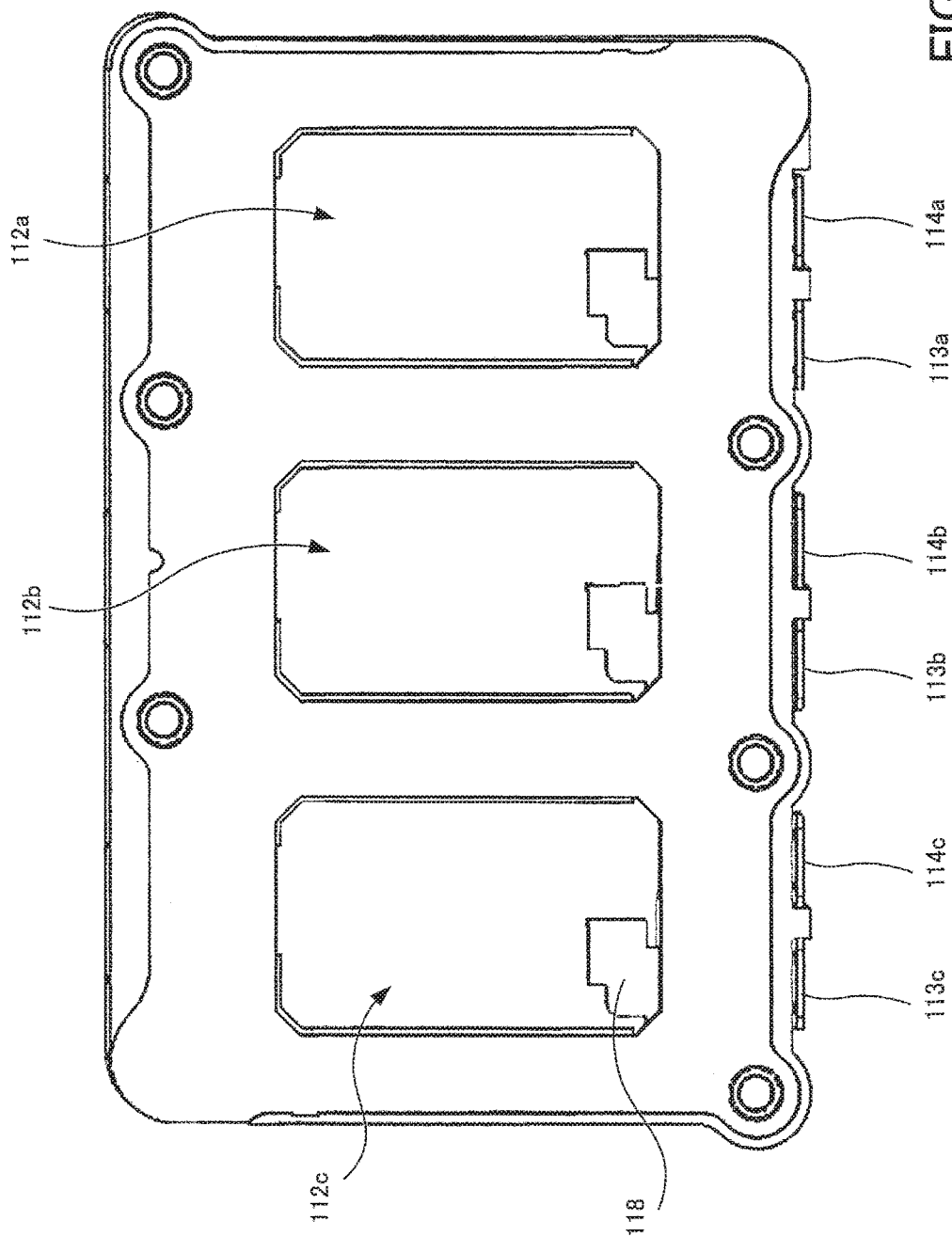
FIG. 14 is a rear view of the case of the semiconductor device according to the present embodiment.

FIG. 13 is a plan view of a case of the semiconductor device according to the present embodiment and FIG. 14 is a rear view of the case of the semiconductor device according to the present embodiment.

As one example, the case 110 is formed by injection molding using resin to produce a frame-like structure that has a concave portion formed in a center thereof. The housing portions 112a, 112b, and 112c in which the respective multilayer substrates 140 described above are housed are formed in the concave portion in the center. Printed circuit boards 119a and 119b are disposed at outer edges (along the shorter axis of the case 110) of the housing portion 112a. A pair of printed circuit boards 119a are disposed at outer edges (along the shorter axis of the case 110) of the housing portion 112b. Printed circuit boards 119a and 119b are disposed at outer edges (along the shorter axis of the case 110) of the housing portion 112c. The printed circuit boards 119a and 119b are disposed so as to be integrated when the case 110 is molded.

The P terminal 113a and the N terminal 114a are provided on one edge (the lower edge in FIG. 14) along the longer axis of the case 110 and the U terminal 115a is provided on the opposite edge (the upper edge) corresponding to the housing portion 112a of the case 110. In the same way, the P terminal 113b and the N terminal 114b are provided on one edge (the lower edge in FIG. 14) along the longer axis of the case 110 and the V terminal 115*b* is provided on the opposite edge (the upper edge) corresponding to the housing portion 112*b*. The P terminal 113*c* and the N terminal 114*c* are provided on one edge (the lower edge in FIG. 14) along the longer axis and the W terminal 115*c* is provided on the opposite edge (the upper edge) corresponding to the housing portion 112*c*.

Wiring terminals 118 that are electrically connected to the P terminals 113*a*, 113*b*, and 113*c* and project out from the P terminals 113*a*, 113*b*, and 113*c* are disposed on the housing portions 112*a*, 112*b*, and 112*c*. Note that each wiring terminal 118 includes a side surface portion 118*b* that is erected on the base surface portion 118*a* (so as to be perpendicular to the base surface portion 118*a*) at an edge of the wiring terminal 118 that faces a wiring terminal (or "first wiring terminal") 117, described later. The thickness of the side surface portion 118*b* is around 1.0 mm to 1.5 mm, for example.

Also, the terminal blocks 120 and 130 are respectively disposed on the printed circuit boards 119*a* and 119*b* on the U terminal 115*a* side of the housing portion 112*a*, and the control terminals 121 and 131 are electrically connected to the printed circuit boards 119*a* and 119*b*. Note that the terminal blocks 120 and 130 are disposed in the peripheries of the U terminal 115*a*, the V terminal 115*b*, and the W terminal 115*c* on an edge along the longer axis of the case 110.

The terminal blocks 120 and 130 are integrated with the resin of the case 110 by integral molding. During postforming, the terminal blocks 120 and 130 are joined to the case 110 by welding the upper surface, lower surface, or a side surface (or "third surface" between the upper surface and lower surface of the terminal blocks 120 and 130) with heated resin. As the resin, it is possible to use a thermoplastic resin such as polyphenylene sulfide (PPS).

(Step S13) The multilayer substrates 140 provided in step S11*b* are housed in the case 110 formed in step S12. When housing the multilayer substrates 140, the conductor terminals 143*a* are joined to the (rear surface side of) the base surface portions 118*a* of the wiring terminals 118 of the case 110.

More specifically, the multilayer substrates 140 described with reference to FIG. 3 are installed on copper plates or coolers. The multilayer substrates 140 installed on copper plates or coolers are attached to the case 110 so as to be housed in the housing portions 112*a*, 112*b*, and 112*c* of the case 110 described with reference to FIGS. 13 and 14.

(Step S14) Control electrodes, such as the gate electrodes, of the semiconductor chips 144*a*, 144*b*, and 144*c* are connected to the printed circuit boards 119*a* by the wires 148 and control electrodes, such as the gate electrodes, of the semiconductor chips 146*a*, 146*b*, and 146*c* are connected to the printed circuit boards 119*b* by the wires 148.

Note that the semiconductor chips 144*a*, 144*b*, and 144*c* may be disposed so that the control electrodes are aligned along the printed circuit boards 119*a*. This also applies to the semiconductor chips 146*a*, 146*b*, and 146*c*. Disposing the semiconductor chips in this way makes it easy to make connections using the wires 148. When RC-IGBT are used as the semiconductor chip 144*a* and the like, it is easy to align the control electrodes as depicted in FIG. 3.

(Step S15) Wiring terminals (or "second wiring terminals") 116 are joined by welding to one end of the U terminal 115*a*, the V terminal 115*b*, and the W terminal 115*c* of the case 110 as depicted in FIG. 1, to the conductor terminal 143*b* of each multilayer substrate 140, and to (the plate portion 145*aa* of) the jumper terminal 145*a*. By doing so, a wiring terminal 116, one of the U terminal 115*a*, the V terminal 115*b*, and the W terminal 115*c*, a conductor terminal 143*b* of a multilayer substrate 140, and a jumper terminal 145*a* are electrically connected.

The wiring terminals 117 are joined by welding to one end of the N terminals 114*a*, 114*b*, and 114*c* of the case 110 as depicted in FIG. 1 and to (the plate portions 145*ba* of) the jumper terminals 145*b*. By doing so, a wiring terminal 117, one of the N terminals 114*a*, 114*b*, and 114*c*, and a jumper terminal 145*b* are electrically connected.

By doing so, the construction of the semiconductor device 100 depicted in FIG. 1 is obtained.

Figure 16:
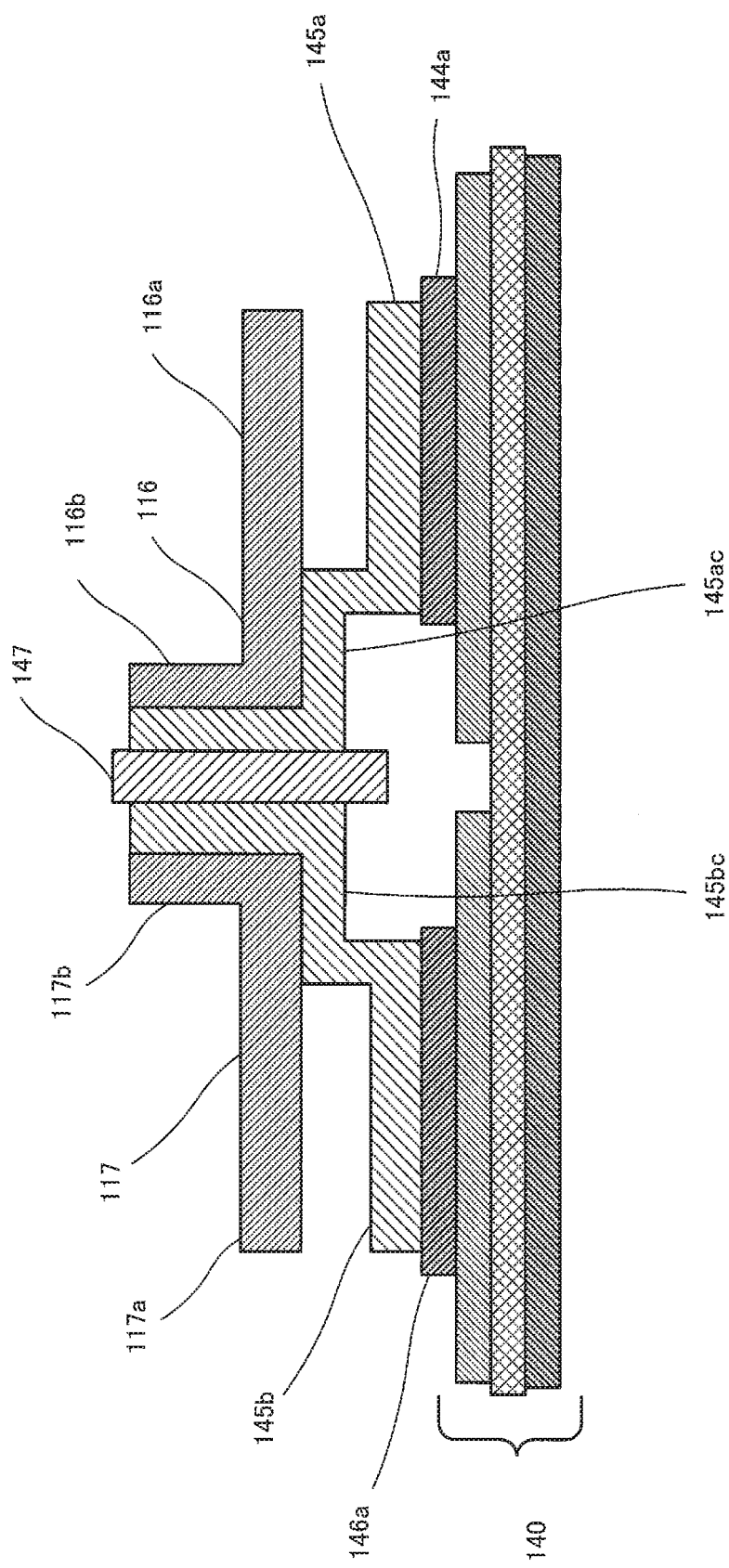
FIG. 16 is a cross-sectional view of the wiring terminals and the multilayer substrate of the semiconductor device according to the present embodiment.
Figure 17:
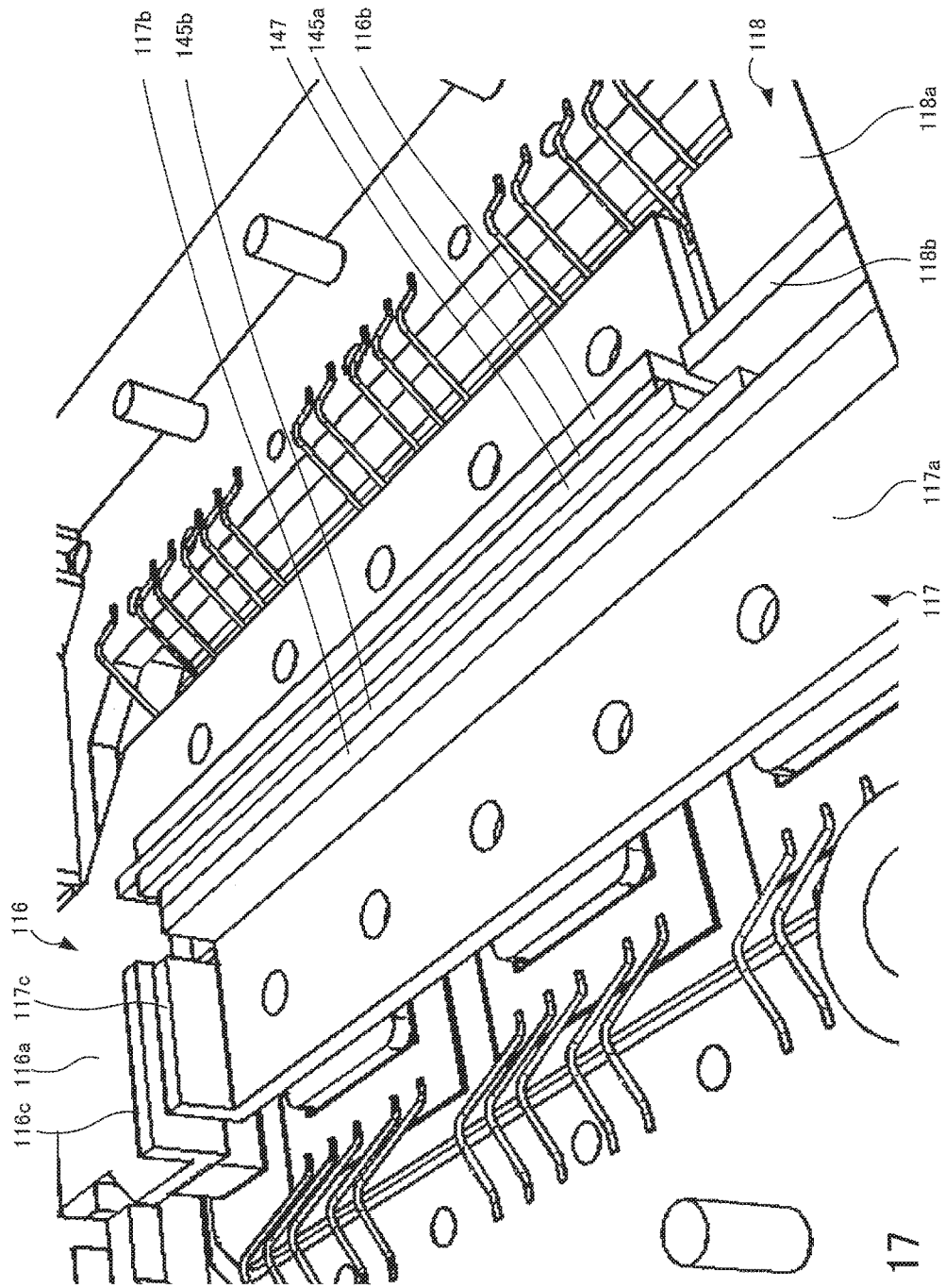
FIG. 17 is an enlarged view of a principal part of the semiconductor device according to the present embodiment.

The wiring terminals 116 and 117 will now be described with reference to FIG. 1 and FIGS. 15 to 17. FIG. 15 is a perspective view of the wiring terminals of the semiconductor device according to the present embodiment. FIG. 16 is a cross-sectional view of wiring terminals and a multilayer substrate of the semiconductor device according to the present embodiment, taken along the dot-dash line X-X in FIG. 1. FIG. 17 is an enlarged view of a principal part of the semiconductor device according to the present embodiment.

Each wiring terminal 116 includes a base surface portion 116*a*, a side surface portion 116*b*, and a side surface portion 116*c*. As depicted in FIGS. 1 and 17, a rear surface side (the lower surface side in the drawings) of one end of a base surface portion 116*a* is joined to one end of one of the U terminal 115*a*, the V terminal 115*b*, and the W terminal 115*c* and to the conductor terminal 143*b*, and the other end of the base surface portion 116*a* extends in parallel with the printed circuit boards 119*a* and 119*b* to a position close to a wiring terminal 118.

Also, as depicted in FIG. 16, the base surface portion 116*a* is supported from below (on the lower surface side in the drawing) on the stepped portions 145*ac* of a jumper terminal 145*a*. The base surface portion 116*a* also protrudes from the stepped portions 145*ac*, so that gaps are provided between the protruding parts of the base surface portion 116*a* and the terminal portions 145*ab*. As depicted in FIG. 15, throughholes 116*d* that pass through from the upper surface in the drawing as far as the lower surface are also formed in the protruding part of the base surface portion 116*a*. By providing the through-holes 116*d* in the protruding part of the base surface portion 116*a* in this way, it is possible, when sealing the semiconductor device 100 with resin, to introduce resin into the through-holes 116*d*, which increases the adhesion with the resin and makes it difficult for the resin to become detached.

As depicted in FIGS. 1, 16, and 17, the side surface portion 116*b* is a surface provided so as to be erected in an L shape from the base surface portion 116*a* (so as to be perpendicular to the base surface portion 116*a*) at an edge of the base surface portion 116*a* that faces a wiring terminal 117. As depicted in FIGS. 1, 16, and 17, the side surface portion 116*b* is disposed in parallel with a side surface portion 117*b*, described later, is joined to (the plate portion 145*aa* of) a jumper terminal 145*a*, and is thereby electrically connected to the jumper terminal 145*a*.

As one example, the side surface portion 116*b* is joined to the plate portion 145*aa* at an upper end (the opposite side to the multilayer substrate 140) of the plate portion 145*aa*. In this way, by joining the side surface portion 116*b* at the upper end side of the plate portion 145*aa*, it is possible to position the joint away from the semiconductor chips. With this configuration, the semiconductor device 100 makes it possible to weaken the stress that is transmitted to a semiconductor chip and/or a multilayer substrate 140 due to expansion and the like of a wiring terminal 116, and thereby avoid cracks and damage to the semiconductor chips and/or the multilayer substrates 140, which improves the reliability of the semiconductor device 100.

As depicted in FIGS. 1 and 17, the side surface portion 116c is a surface provided so as to be erected in an L shape from the base surface portion 116a (so as to be perpendicular to the base surface portion 116a) at an edge of the base surface portion 116a that faces the wiring terminal 117, and is disposed in parallel with a side surface portion 117c of the wiring terminal 117. The thickness of the side surface portions 116b and 116c is 1.0 mm to 1.5 mm, for example.

Each wiring terminal 117 includes a base surface portion 117a, the side surface portion 117b, and the side surface portion 117c. As depicted in FIGS. 1 and 17, a rear surface side (the lower surface side in the drawings) of one end of a base surface portion 117a is joined to one end of the one of the N terminals 114a, 114b, and 114c and the other end of the base surface portion 117a extends in parallel with the printed circuit boards 119a and 119b to a position close to a wiring terminal 116.

Also, as depicted in FIG. 16, the base surface portion 117a is supported from below (on the lower surface side in the drawing) on the stepped portions 145bc of a jumper terminal 145b. The base surface portion 117a also protrudes from the stepped portions 145bc, so that gaps are provided between the protruding parts of the base surface portion 117a and the terminal portions 145bb. As depicted in FIG. 15, through-holes 117d that pass through from the upper surface in the drawing as far as the lower surface are also formed in the protruding part of the base surface portion 117a. By providing the through-holes 117d in the protruding part of the base surface portion 117a in this way, it is possible, when sealing the semiconductor device 100 with resin, to introduce resin into the through-holes 117d, which increases the adhesion with the resin and makes it difficult for the resin to become detached.

As depicted in FIGS. 1, 16, and 17, the side surface portion 117b is a surface provided so as to be erected in an L shape from the base surface portion 117a (so as to be perpendicular to the base surface portion 117a) at an edge of the base surface portion 117a that faces a wiring terminal 116 and a wiring terminal 118. As depicted in FIGS. 1, 16, and 17, the side surface portion 117b is disposed in parallel with the side surface portions 116b and 118b, described later, is joined to (the plate portion 145ba of) a jumper terminal 145b, and is thereby electrically connected to the jumper terminal 145b.

As one example, the side surface portion 117b is joined to the plate portion 145ba at an upper end side (the opposite side to the multilayer substrate 140) of the plate portion 145ba. In this way, by joining the side surface portion 117b at the upper end side of the plate portion 145ba, it is possible to position the joint away from the semiconductor chips. With this configuration, the semiconductor device 100 makes it possible to weaken the stress that is transmitted to a semiconductor chip and/or a multilayer substrate 140 due to expansion and the like of a wiring terminal 117 and thereby avoid cracks and damage to the semiconductor chip and/or the multilayer substrate 140, which improves the reliability of the semiconductor device 100.

As depicted in FIGS. 1 and 17, the side surface portion 117c is a surface provided so as to be erected in an L shape from the base surface portion 117a (so as to be perpendicular to the base surface portion 117a) at an edge of the base surface portion 117a that faces a wiring terminal 116 and is disposed in parallel with a side surface portion 116c of the wiring terminals 116. The thickness of the side surface portions 117b and 117c is 1.0 mm to 1.5 mm, for example.

In this way, the side surface portion 116b and the side surface portion 117b are disposed in parallel so as to sandwich the plate portion 145aa, the plate portion 147a, and the plate portion 145ba that are disposed in parallel.

That is, in the semiconductor device 100, the side surface portion 117b and the plate portion 145ba that are electrically connected and the side surface portion 116b and the plate portion 145aa that are electrically connected are disposed in parallel with the plate portion 147a in between. Also in the semiconductor device 100, the side surface portion 116c and the side surface portion 117c are disposed in parallel. In the semiconductor device 100, the side surface portion 117b and the side surface portion 118b are also disposed in parallel.

Figure 18:
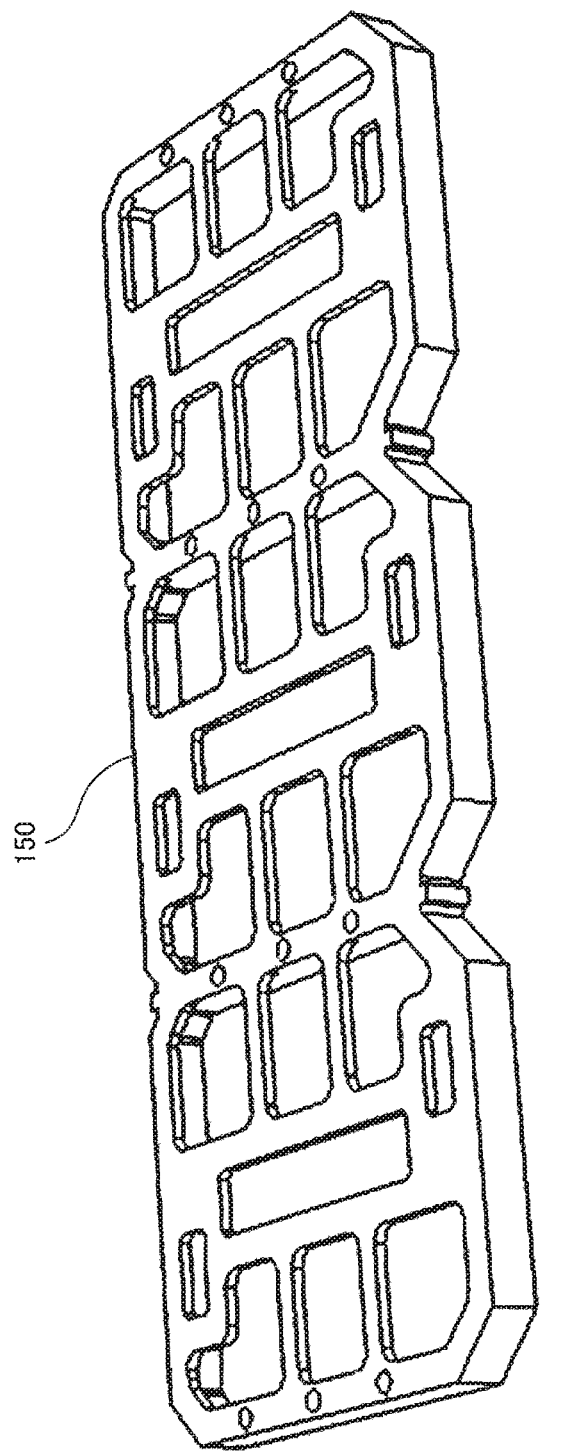
FIG. 18 is a perspective view of a resin block of the semiconductor device according to the present embodiment.

(Step S16) A resin block is fitted into the concave portion of the case 110. The resin block will now be described with reference to FIG. 18. FIG. 18 is a perspective view of a resin block of the semiconductor device according to the present embodiment.

The resin block 150 is formed of resin and as one example is constructed as a combination of a plurality of frames so as to fit into a concave portion in a center of the semiconductor device 100. By including this resin block 150, it is possible to increase the modulus of rigidity of the semiconductor device 100 and to reduce deformation that occurs due to bending or twisting caused by external shocks or the like. This means that it is possible to prevent shocks and damage to the semiconductor chips 144a, 144b, and 144c and the semiconductor chips 146a, 146b, and 146c inside the semiconductor device 100.

(Step S17) The multilayer substrates 140, the printed circuit boards 119a and 119b, the wiring terminals 116, 117, and 118, the wires 148, and the like inside the concave portion in the case 110 are sealed using sealing resin and the sealing resin is hardened. By doing so, the semiconductor device 100 is completed. As the sealing resin, it is possible to use epoxy resin, for example.

Figure 19:
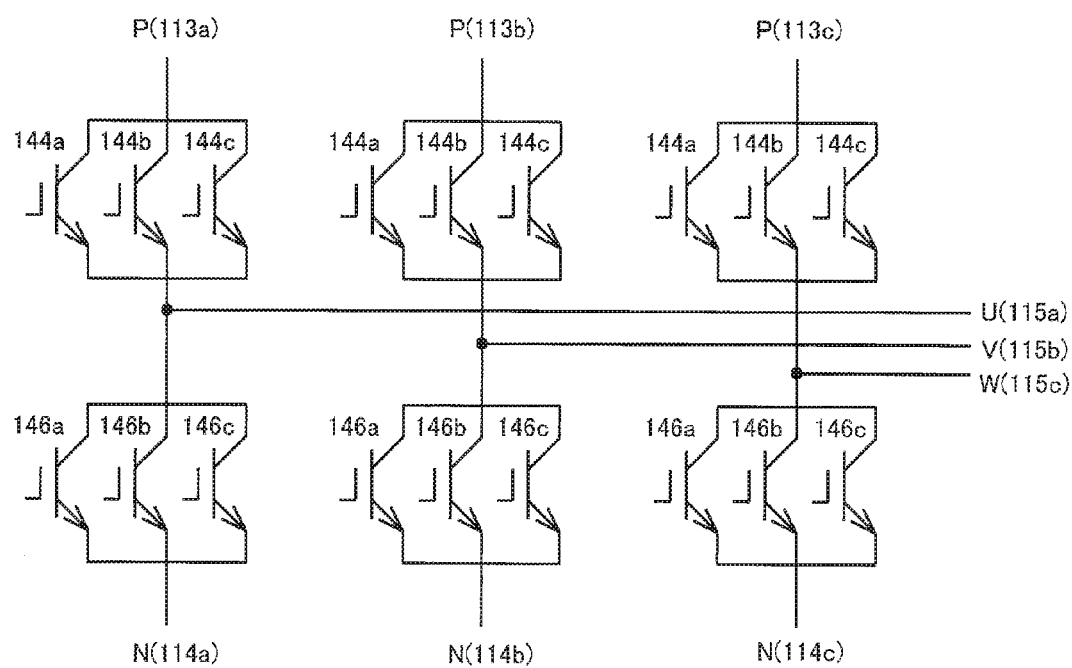
FIG. 19 is a circuit diagram depicting a circuit configuration constructed inside the semiconductor device according to the present embodiment.

Next, the circuit configuration constructed by the semiconductor device 100 described above will be described with reference to FIGS. 1, 3, and 19. FIG. 19 is a circuit diagram of the circuit configuration constructed inside the semiconductor device according to the present embodiment.

At the multilayer substrate 140 (see FIGS. 1 and 3) in the housing portion 112a of the semiconductor device 100, the conductor terminal 143a that is electrically connected via the wiring terminal 118 to the P terminal 113a is electrically connected via the circuit board 142a to the collector electrodes of the semiconductor chips 144a, 144b, and 144c. The wiring terminal 116 is electrically wired to the jumper terminal 145a that is electrically connected to the emitter electrodes of the semiconductor chips 144a, 144b, and 144c, and the wiring terminal 116 is electrically connected to the U terminal 115a.

The conductor terminal 143b is electrically connected to the wiring terminal 116 that is electrically connected to the U terminal 115a and is electrically connected via the circuit board 142b to the collector electrodes of the semiconductor chips 146a, 146b, and 146c. The wiring terminal 117 is electrically wired to the jumper terminal 145b that is electrically connected to the emitter electrodes of the semiconductor chips 146a, 146b, and 146c, and the wiring terminal 117 is electrically connected to the N terminal 114a.

At the multilayer substrate 140 (see FIGS. 1 and 3) of the housing portion 112b of the semiconductor device 100, the conductor terminal 143a that is electrically connected via the wiring terminal 118 to the P terminal 113b is electrically connected via the circuit board 142a to the collector electrodes of the semiconductor chips 144a, 144b, and 144c. The wiring terminal 116 is electrically wired to the jumper terminal 145a that is electrically connected to the emitter electrodes of the semiconductor chips 144a, 144b, and 144c, and the wiring terminal 116 is electrically connected to the V terminal 115b.

The conductor terminal 143b is electrically connected to the wiring terminal 116 that is electrically connected to the V terminal 115b and is electrically connected via the circuit board 142b to the collector electrodes of the semiconductor chips 146a, 146b, and 146c. The wiring terminal 117 is electrically wired to the jumper terminal 145b that is electrically connected to the emitter electrodes of the semiconductor chips 146a, 146b, and 146c, and the wiring terminal 117 is electrically connected to the N terminal 114b.

At the multilayer substrate 140 (see FIGS. 1 and 3) of the housing portion 112c of the semiconductor device 100, the conductor terminal 143a that is electrically connected via the wiring terminal 118 to the P terminal 113c is electrically connected via the circuit board 142a to the collector electrodes of the semiconductor chips 144a, 144b, and 144c. The wiring terminal 116 is electrically wired to the jumper terminal 145a that is electrically connected to the emitter electrodes of the semiconductor chips 144a, 144b, and 144c, and the wiring terminal 116 is electrically connected to the W terminal 115c.

The conductor terminal 143b is electrically connected to the wiring terminal 116 that is electrically connected to the W terminal 115c and is electrically connected via the circuit board 142b to the collector electrodes of the semiconductor chips 146a, 146b, and 146c. The wiring terminal 117 is electrically wired to the jumper terminal 145b that is electrically connected to the emitter electrodes of the semiconductor chips 146a, 146b, and 146c, and the wiring terminal 117 is electrically connected to the N terminal 114c.

By using this configuration, the circuit depicted in FIG. 19 is configured inside the semiconductor device 100.

Accordingly, in a state were the positive electrode of a power supply is connected to the P terminal 113a and the negative electrode is connected to the N terminal 114a, a control signal is inputted and outputted to and from an external circuit via the control terminals 121 and 131 and the printed circuit boards 119a and 119b. In accordance with the control signal, a control signal is inputted via the printed circuit boards 119a and 119b and the wires 148 into the gate electrodes of the semiconductor chips 144a, 144b, and 144c and also the semiconductor chips 146a, 146b, and 146c, and an output is obtained from the U terminal 115a in keeping with the control signal.

In a state where the positive electrode is connected to the P terminal 113b and the negative electrode is connected to the N terminal 114b, a control signal is inputted and outputted via the control terminals 121 and 131 and the printed circuit boards 119a and 119b. In accordance with the control signal, a control signal is inputted via the printed circuit boards 119a and 119b and the wires 148 into the gate electrodes of the semiconductor chips 144a, 144b, and 144c and also the semiconductor chips 146a, 146b, and 146c, and an output is obtained from the V terminal 115b in keeping with the control signal.

Meanwhile, in a state where the positive electrode is connected to the P terminal 113c and the negative electrode is connected to the N terminal 114c, a control signal is inputted and outputted via the control terminals 121 and 131 and the printed circuit boards 119a and 119b. In accordance with the control signal, a control signal is inputted via the printed circuit boards 119a and 119b and the wires 148 into the gate electrodes of the semiconductor chips 144a, 144b, and 144c and also the semiconductor chips 146a, 146b, and 146c, and an output is obtained from the W terminal 115c in keeping with the control signal.

However, as described earlier, in the semiconductor device 100, the side surface portion 117b and the plate portion 145ba that are electrically connected and the side surface portion 116b and the plate portion 145aa that are electrically connected are disposed in parallel so as to sandwich the plate portion 147a. Also, in the semiconductor device 100, the side surface portion 116c and the side surface portion 117c are disposed facing one another in parallel. In the semiconductor device 100, the side surface portion 117b and the side surface portion 118b are also disposed facing one another in parallel. This means that it is possible to increase the area where the jumper terminal 145a and the wiring terminals 116 and 118 disposed on the P terminal (upper arm) side and the jumper terminal 145b and the wiring terminal 117 disposed on the N terminal (lower arm) side face one another, which makes it possible to reduce the inductance of the main circuit.

In more detail, according to the circuit configuration described above and the configuration of the semiconductor device 100, the magnetic field produced by a current flowing in the side surface portion 117b and the plate portion 145ba and the magnetic field produced by a current flowing in the side surface portion 116b and the plate portion 145aa that are disposed in parallel cancel each other out.

Similarly, the magnetic field produced by the current flowing in the side surface portion 117c and the magnetic field produced by the current flowing in the side surface portion 116c disposed in parallel cancel each other out.

Also, the magnetic field produced by the current flowing in the side surface portion 117b and the magnetic field produced by the current flowing in the side surface portion 118b that are disposed in parallel cancel each other out.

That is, the semiconductor device 100 makes it possible to weaken magnetic fields and to prevent malfunctioning of the semiconductor device 100 due to magnetic fields. By doing so, the reliability of the semiconductor device 100 is improved.

In addition, since the respective semiconductor chips are positioned by the resin plate 147 sandwiched between the jumper terminals 145a and 145b, an assembly step that mounts the respective semiconductor chips and the jumper terminals 145a and 145b on the multilayer substrates 140 is facilitated and it is also possible to miniaturize the semiconductor device 100.

Note that it is also possible to integrally form the wiring terminals 116 and 117 on the rear surface side of the resin block 150 corresponding to the housing portions 112a, 112b, and 112c. By integrally forming the resin block 150 and the wiring terminals 116 and 117, it is possible to dispose the wiring terminals 116 and 117 in a single operation, which makes the semiconductor device 100 easier to assemble. When doing so, it is possible to form the resin block of resin in units of the housing portions and to integrally form a pair of the wiring terminals 116 and 117 on the rear surface of such resin blocks in housing portion units. In this way, by integrally forming the resin blocks and the wiring terminals 116 and 117 in units of the housing portions, it is possible to guide the wiring terminals 116 and 117 to appropriate positions on the jumper terminals 145a and 145b, which makes it possible to favorably join the wiring terminals 116 and 117.

It is also possible to integrally form the wiring terminals 116 and 117 and the case 110.

The semiconductor device 100 may include a pair of multilayer substrates 140, the semiconductor chips 144a to 144c and 146a to 146c, the jumper terminals 145a and 145b, the resin plates 147, input terminals (the P terminal 113a and the N terminal 114a) and output terminals (U terminals 115a) and be configured as a single-phase power semiconductor module.

According to the present embodiment, it is possible to prevent malfunctioning of a semiconductor device and thereby improve the reliability of the semiconductor device.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A semiconductor device comprising:
   a multilayer substrate including an insulating substrate, a first circuit board disposed on a front surface of the insulating substrate, and a second circuit board disposed on the front surface in parallel with the first circuit board;
   a first semiconductor chip disposed on the first circuit board;
   a second semiconductor chip disposed on the second circuit board;
   a first jumper terminal including
      a first terminal portion electrically connected to a main electrode of the first semiconductor chip, and
      a first plate member;
   a second jumper terminal including
      a second terminal portion electrically connected to a main electrode of the second semiconductor chip, and
      a second plate member; and
   a resin plate including
      a first positioning portion placed on a front surface of the first circuit board and regulating a position of the first semiconductor chip with respect to the first circuit board,
      a second positioning portion placed on a front surface of the second circuit board and regulating a position of the second semiconductor chip with respect to the second circuit board, and
      a plate portion that is sandwiched between the first plate member and the second plate member at a position between the first circuit board and the second circuit board, wherein
   the first positioning portion is formed as a first protruding stepped part when viewed from above, and the first protruding stepped part regulates the position of the first semiconductor chip at two edges of the first protruding stepped part, and
   the second positioning portion is formed as a second protruding stepped part when viewed from above, and the second protruding stepped part regulates the position of the second semiconductor chip at two edges of the second protruding stepped part.

2. The semiconductor device according to claim 1, wherein
   the first plate member and the second plate member are disposed in parallel, and
   a current flow in the first plate member is in a direction opposite to a direction of a current flow in the second plate member.

3. The semiconductor device according to claim 1, wherein the plate portion is sized so as to include a region where the first plate member and the second plate member overlap.

4. The semiconductor device according to claim 1, wherein the resin plate includes:
   a first insertion portion into which the first plate member is inserted; and
   a second insertion portion into which the second plate member is inserted.

5. The semiconductor device according to claim 4, wherein
   the first insertion portion is provided between the plate portion and the first positioning portion, and
   the second insertion portion is provided between the plate portion and the second positioning portion.

6. The semiconductor device according to claim 1, further comprising:
   a case that houses the multilayer substrate;
   a first external terminal that is provided on the case and connects an inside and an outside of the case;
   a second external terminal that is provided on the case adjacent to the first external terminal and connects the inside and the outside of the case;
   a third external terminal that is provided on the case on an opposite side to a side of the case where the first external terminal is disposed, and connects the inside and the outside of the case;
   a first wiring terminal including
      a first base surface portion parallel to the multilayer substrate, the first base surface portion including one end connecting to the first external terminal, and another end extending to a position close to the third external terminal, and
      a first side surface portion that is perpendicular to the first base surface portion and electrically connects to the second plate member; and
   a second wiring terminal including
      a second base surface portion parallel to the multilayer substrate, the second base surface portion including one end connecting to the third external terminal, and another end extending to a position close to the second external terminal, and
      a second side surface portion that is perpendicular to the second base surface portion and electrically connects to the first plate member.

7. The semiconductor device according to claim 6, wherein
   the first side surface portion is parallel to the second plate member,
   the second side surface portion is parallel to the first plate member, and
   the first plate member, the plate portion, and the second plate member are sandwiched between the first side surface portion and the second side surface portion.

8. The semiconductor device according to claim 6, further comprising a third wiring terminal including
   a third base surface portion parallel to the multilayer substrate, the third base surface portion including one end connecting to the second external terminal, and another end extending to a position close to the second base surface portion,
a third side surface portion that is perpendicular to the third base surface portion at an edge of the third base surface portion that faces the first base surface portion,
wherein the first side surface portion extends to a position that faces the third side surface portion.

9. The semiconductor device according to claim 6, wherein
the first wiring terminal includes another first side surface portion that is perpendicular to the first base surface portion at an edge at said another end of the first base surface portion, said another end of the first base surface portion facing the second base surface portion, and
the second wiring terminal includes another second side surface portion that is perpendicular to the second base surface portion at an edge of the second base surface portion that faces said another end of the first base surface portion.

10. The semiconductor device according to claim 1, wherein
the plate portion protrudes from an upper end of the first plate member and protrudes from a lower end of the second plate member, when viewed from above.

11. The semiconductor device according to claim 1, wherein
the plate portion protrudes from upper ends and lower ends of the first and second plate members, when viewed in cross-section.

12. The semiconductor device according to claim 1, wherein
one end of each of the first plate member, the plate portion, and the second plate member in length direction is disposed so as to be displaced in order, so that two side surfaces of the plate portion that are adjacent to the one end of the plate portion are exposed between the first and second plate members, and
an other end of each of the first plate member, the plate portion, and the second plate member opposite to the one end is disposed so as to be displaced in order.

13. A semiconductor device comprising:
a multilayer substrate including an insulating substrate, a first circuit board disposed on a front surface of the insulating substrate, and a second circuit board disposed on the front surface in parallel with the first circuit board;
a first semiconductor chip disposed on the first circuit board;
a second semiconductor chip disposed on the second circuit board;
a first jumper terminal including
a first terminal portion electrically connected to a main electrode of the first semiconductor chip, and
a first plate member;
a second jumper terminal including
a second terminal portion electrically connected to a main electrode of the second semiconductor chip, and
a second plate member; and
a resin plate including a first positioning portion placed on a front surface of the first circuit board and regulating a position of the first semiconductor chip with respect to the first circuit board,
a second positioning portion placed on a front surface of the second circuit board and regulating a position of the second semiconductor chip with respect to the second circuit board, and
a plate portion that is sandwiched between the first plate member and the second plate member at a position between the first circuit board and the second circuit board,
wherein the resin plate includes
a first insertion portion into which the first plate member is inserted, and
a second insertion portion into which the second plate member is inserted.

14. The semiconductor device according to claim 13, wherein
the first insertion portion is provided between the plate portion and the first positioning portion, and
the second insertion portion is provided between the plate portion and the second positioning portion.

15. A semiconductor device comprising:
a multilayer substrate including an insulating substrate, a first circuit board disposed on a front surface of the insulating substrate, and a second circuit board disposed on the front surface in parallel with the first circuit board;
a first semiconductor chip disposed on the first circuit board;
a second semiconductor chip disposed on the second circuit board;
a first jumper terminal including
a first terminal portion electrically connected to a main electrode of the first semiconductor chip, and
a first plate member electrically connected to the first terminal portion;
a second jumper terminal including
a second terminal portion electrically connected to a main electrode of the second semiconductor chip, and
a second plate member electrically connected to the second terminal portion; and
a resin plate including
a first positioning portion placed on a front surface of the first circuit board and regulating a position of the first semiconductor chip with respect to the first circuit board,
a second positioning portion placed on a front surface of the second circuit board and regulating a position of the second semiconductor chip with respect to the second circuit board, and
a plate portion that is sandwiched between the first plate member and the second plate member at a position between the first circuit board and the second circuit board,
wherein a first surface of the first plate member of the first jumper terminal is mounted to the plate portion of the resin plate, and
a length of the first positioning portion in a first direction perpendicular to the first surface is greater than a width of the first plate member in the first direction.

* * * * *